(12) United States Patent
Hahn et al.

(10) Patent No.: US 10,501,670 B2
(45) Date of Patent: Dec. 10, 2019

(54) DIELECTRIC FLUID AND COOLANT MADE WITH BIOBASED BASE OIL

(71) Applicant: Novvi LLC, Emeryville, CA (US)

(72) Inventors: Hyeok Hahn, Santa Clara, CA (US);
Jeffrey Brown, San Carlos, CA (US);
Paula Vettel, Downers Grove, IL (US);
Jason R Wells, Fremont, CA (US)

(73) Assignee: Novvi LLC, Emeryville, CA (US)

( * ) Notice: Subject to any disclaimer, the term of this patent is extended or adjusted under 35 U.S.C. 154(b) by 222 days.

(21) Appl. No.: 15/120,610

(22) PCT Filed: Mar. 17, 2015

(86) PCT No.: PCT/US2015/021018
§ 371 (c)(1),
(2) Date: Aug. 22, 2016

(87) PCT Pub. No.: WO2015/142887
PCT Pub. Date: Sep. 24, 2015

(65) Prior Publication Data
US 2017/0009119 A1    Jan. 12, 2017

Related U.S. Application Data

(60) Provisional application No. 61/954,511, filed on Mar. 17, 2014.

(51) Int. Cl.
*C09K 5/10* (2006.01)
*H01B 3/22* (2006.01)
(Continued)

(52) U.S. Cl.
CPC ........... *C09K 5/10* (2013.01); *C08K 5/01* (2013.01); *H01B 3/20* (2013.01); *H01B 3/22* (2013.01);
(Continued)

(58) Field of Classification Search
None
See application file for complete search history.

(56) References Cited

U.S. PATENT DOCUMENTS 4,284,522 A    8/1981  Olmsted
6,398,986 B1 *  6/2002  McShane ............... C09K 5/10
                                                    174/17 LF
(Continued)

FOREIGN PATENT DOCUMENTS

EP    1969607 B1    3/2010
WO    0026925       5/2000
(Continued)

OTHER PUBLICATIONS

Patent Cooperation Treaty, International Search Report for PCT/US15/21018, dated Jul. 3, 2015, 4 pages.
(Continued)

*Primary Examiner* — Katie L. Hammer
(74) *Attorney, Agent, or Firm* — Bryan Cave Leighton Paisner LLP

(57) ABSTRACT

A dielectric fluid and coolant for electrical apparatuses such as transformers. In one embodiment, the fluid contains more than 25% biobased base oil, such as a biobased hydrocarbon oil, which has a molecular weight greater than 300 g/mol and less than 595 g/mol. The biobased base oil may optionally be blended with other oils, such as mineral oils and vegetable oils.

19 Claims, 2 Drawing Sheets

(51) Int. Cl.
*H01F 27/10* (2006.01)
*H01G 2/08* (2006.01)
*H01H 9/52* (2006.01)
*H05K 7/20* (2006.01)
*H01B 3/20* (2006.01)
*C08K 5/01* (2006.01)

(52) U.S. Cl.
CPC ............ *H01F 27/105* (2013.01); *H01G 2/08* (2013.01); *H01H 9/52* (2013.01); *H05K 7/20927* (2013.01)

(56) References Cited

U.S. PATENT DOCUMENTS

| | | | |
|---|---|---|---|
| 8,268,199 B1 * | 9/2012 | Forest | C10M 105/42 252/570 |
| 2002/0139962 A1 | 10/2002 | Fefer et al. | |
| 2008/0283803 A1 * | 11/2008 | Rapp | H01B 3/20 252/578 |
| 2009/0036337 A1 | 2/2009 | Deskin et al. | |
| 2009/0137435 A1 * | 5/2009 | Hilker | C10M 169/04 508/279 |
| 2010/0059725 A1 | 3/2010 | Sinclair et al. | |
| 2012/0119862 A1 | 5/2012 | Franklin et al. | |

FOREIGN PATENT DOCUMENTS

| | | | | |
|---|---|---|---|---|
| WO | 2012141784 | | 10/2012 | |
| WO | 2013101414 | | 7/2013 | |
| WO | 2014128227 | | 8/2014 | |
| WO | WO-2014128277 A1 * | 8/2014 | ........... C07D 333/22 |

OTHER PUBLICATIONS

European Patent Office, Extended European Search Report issued for App. No. 15764090.5; Pub. No. 3120368, 6 pages dated Oct. 19, 2017.

* cited by examiner

DIELECTRIC FLUID AND COOLANT MADE WITH BIOBASED BASE OIL

This disclosure relates to dielectric fluids. In particular, the disclosure relates to biobased base oil dielectric fluids, such as isoparaffinic hydrocarbon based fluids derived from hydrocarbon terpenes such as myrcene, ocimene and farnesene.

Dielectric fluids are non-conducting fluids that can sustain a steady electric field and act as an electrical insulator. Dielectric fluids are useful in a variety of applications, such as, for example, transformers, capacitors, switching gears, transmission components, distribution components, switches, regulators, and circuit breakers. In such applications, dielectric fluids dissipate heat generated by energizing components and insulate those components from the equipment enclosure and other internal parts and devices.

A dielectric fluid has a number of properties which affect its ability to function effectively and reliably. These properties include flash and fire point, heat capacity, thermal conductivity, viscosity over a range of temperatures, impulse breakdown voltage, dielectric breakdown voltage, power factor, gassing tendency, and pour point. Industrial standards use a combination of these parameters to provide guidelines on a fluid's efficiency and reliability at any given moment. Such industrial standards include for example and without limitation: IEC-60296 (mineral oil); ASTM-D3487 (mineral oil); IS-1866 (mineral oil); CSA-50 (mineral oil); ASTM-D6871 (natural ester); and IEEE Standard C57.147 (natural ester). Tables 1 and 2 provide three examples out of many accepted standards in the transformer industry.

TABLE 1

ASTM D3487 and D6871 Specification for Insulating Oil Used in Electrical Apparatus

| Properties | Method | ASTM D3487 (mineral oil) Requirements | ASTM D6871 (natural ester) Requirements |
|---|---|---|---|
| Flash Point | D92-12b | >145° C. | >275° C. |
| Fire Point | D92-12b | no requirement | >300° C. |
| Interfacial Tension @ 25° C. | D971-12 | >40 dynes/cm | no requirement |
| Pour Point, ° C. | D97-12 | <−40 | <−10 |
| Viscosity at 100° C. | D445-14a | <3 cSt | <15 cSt |
| Viscosity at 40° C. | D445-14a | <12 cSt | <50 cSt |
| Viscosity at 0° C. | D445-14a | <76 cSt | — |
| Dielectric Breakdown | D877-13 | >30 kV | >30 kV |
|  | D1816-12 (1 mm gap) | >20 kV | — |
| Impulse Breakdown Voltage | D3300-12 @ 25° C. | >145 kV | — |
| Power Factor | D924-08 @ 25° C. | <0.05% | <0.2% |
|  | D924-08 @ 100° C. | <0.30% | <4.0% |
| Oxidation Stability (Acid Sludge) | D2440-13 @ 72 hr | % sludge <0.1% Total Acid No. <0.3 mg KOH/g | — |
|  | D2440-13 @ 164 hr | % sludge <0.2% Total Acid No. <0.4 mg KOH/g | — |
| Oxidation Stability (RPVOT) | D2112-01a | >195 minutes | — |
| Oxidation Inhibitor Content | D2668-07 | <0.3 wt % | — |
| Water Content | D1533-12 | <30 ppm | <200 ppm |
| Neutralization Number, mg KOH/g | D974 | <0.03 mg KOH/g | — |

TABLE 2

IEC 60296 Specification for Insulating Oil Used in Electrical Apparatus

| Properties | Method | Requirements |
|---|---|---|
| Density at 20° C. | ISO 3675, ISO 12185 | <0.895 |
| Viscosity @ 40° C. | D445-14a ISO 3104 | <12 cSt |
| Viscosity @ −30° C. | D445-14a ISO 3104 | <1800 cSt |
| Pour Pt - Referee | D97-12 ISO 3016 | <−40° C. |
| Water Content | D1533-12 IEC 60814 | <20 ppm |
| Dielectric IEC 60156 2.5 mm - As Received | IEC 60156 | >30 kV |
| Dielectric IEC 60156 2.5 mm - After Filtering | IEC 60156 | >30 kV |
| DF @ 90° C. | IEC 60247 | <0.5% |
| DF @ 90° C. | IEC 60247 | <0.005 |
| Acidity IEC 62021 | IEC 62021 | <0.01 mgKOH/g |
| Flash Point for Liquids <200° C., CC | D93-13e1 ISO 2719 | >135° C. |
| Sulfur, Corrosive (DIN 51353) | DIN 51353 | none corrosive |

In transformers, a dielectric fluid cools the internal transformer components and provides part of the electrical insulation between the internal live parts. The dielectric fluid needs to have a long operating life (10-40 years) and stability at high temperatures for an extended period.

Polychlorinated biphenyl compounds (PCBs) have excellent dielectric properties and were once commonly used as a dielectric fluid in transformers and even required by government agencies. However, PCBs were disfavored due to having a negative environmental impact. The industry shifted to napthenic derived transformer oils and those materials cover the majority of the market. There is now another movement to lessen the environmental impact of the transformer oil and properties such as toxicity, biodegradability, and renewability have new importance. Many types of technologies have tried to meet these environmental requirements. Mineral oils, fatty acid esters, vegetable based oils and vegetable seed oils have all been used. Each has some disadvantages with respect to one or more dielectric characteristics needed, such as viscosity, flash point, fire point, pour point, water saturation point, dielectric strength, and oxidative stability, or with respect to the environmental characteristics of renewability, biodegradability, and toxicity. Natural plant oils, for example, are renewable and have excellent biodegradability but typically have high viscosity (especially at low temperatures) associated with a high pour point, and in general, they also may exhibit a tendency to oxidize depending on their source, refining, or handling in general.

Transformer oils most commonly in use are napthenic oils with over 90% market share. Such oils are typically made from a vacuum gas oil fraction derived from naphthenic crudes and in particular light naphthenic distillates. Although transformer oils made from naphthenic crudes perform adequately they are inherently deficient in certain respects. For example, naphthenics are compositionally rich in potentially toxic aromatics and thus there is a desire for compositionally cleaner transformer fluids. At the same time, the supply of some of the naphthenic crudes, which are especially suitable for transformer oil manufacture, is beginning to dwindle. Napthenic oils are not biodegradable due to their chemical structure. As a result there is a desire to supplement the transformer oil pool with other sources.

Isoparaffinic oil based dielectric fluid has been developed to overcome some limitations of naphthenics. Isoparaffinic base oil is typically prepared from paraffinic oils using a hydroisomerization process as well as a GTL (gas-to-liquid) process. Typically, the hydroisomerization process is carried out in two or three stages, a first hydrocracking or hydrotreating step, followed by a hydroisomerization and an optional hydrofinishing or hydrogenation step. All these steps and procedures are well known in the art. Suitable feedstock may be chosen from a wide range of selections, such as waxy gas oils, slack wax from a solvent dewaxing process, refined wax, normal paraffins made by a Fischer Tropsch process, and synthetic polyethylene wax. Resulting base oils from the hydroisomerization process have low pour point (−30° C.~−60° C.), zero sulfur content, increased level of purity, consistent composition, and good oxidative stability in comparison to naphthenic mineral base oil. However, the isoparaffinic base oils still lack desired environmental performances.

Evaluating and predicting the environmental performances of base oils and lubricants is not simple or easy and is still considered a "maturing science." Currently, the most widely employed method of evaluating environmental performance involves testing for biodegradability, environmental toxicity, carbon foot print, carbon neutrality, recyclability, and renewability.

Biodegradability can be determined using one or more standardized test procedures and can provide valuable insight in comparing the potential risk of different lubricant products to the environment. One such guideline and test method has been set by the Organization for Economic Cooperation and Development (OECD) for degradation and accumulation testing.

The OECD has indicated that several tests may be used to determine the "ready biodegradability" of organic chemicals. Among these, aerobic ready biodegradability by the OECD 301B method tests material over a 28-day period and determines biodegradation of the material by measuring the evolution of carbon dioxide from the microbial oxidation of the material's organic carbon. The carbon dioxide produced is trapped in barium hydroxide solution and is quantified by titration of residual hydroxide with standardized hydrogen chloride. To determine the percent biodegradation, the amount of carbon dioxide produced microbially from the test material is compared to its theoretical carbon dioxide content (the complete oxidation of the carbon in the test material to $CO_2$). Positive controls, using sodium benzoate as a reference material, are run to check the viability of the aerobic microorganisms used in the procedure. Blank controls are also run in parallel. Tests, controls, and blanks are run in duplicate.

Using the OECD 301B method (28 day period) for comparison, isoparaffinic oil based dielectric fluid has lower biodegradation than other commercially used and environmentally preferred biodegradable dielectric fluids such as natural and synthetic ester based dielectric fluids. Isoparaffinic oil has great difficulty meeting the industry standard for biodegradability of >60% in the OECD301B test in 28 day. Also, the production of isoparaffinic oil still depends on depleting natural resources and thus has an adverse impact on carbon neutrality (carbon footprint balance).

Renewable (a.k.a. natural) ester based dielectric fluid has two major advantages over other dielectric fluids mentioned above, higher flash point and great biodegradability. However, many of the non-renewable ester based fluids are not considered to be biodegradable in a reasonable time frame. In recent years, regulatory agencies have become increasingly concerned about oil spills which can contaminate the ground soil and other areas. A biodegradable oil is especially desirable for electrical apparatuses such as transformers used in populated areas, underground, near water, non-stationary, or other environmentally sensitive areas.

Renewable ester based dielectric fluids use blends of vegetable, algal or seed oils. Vegetable oils that are high in natural oleic acid levels such as safflower oil, olive oil, canola oil, and rapeseed oils, have reasonable oxidative stability but poor low temperature fluidity (high pour point). On the other hand vegetable oils that are low in oleic acid levels have better low temperature fluidity (lower pour point) but higher numbers of doubles bonds resulting in poor oxidative stability. Hence, balancing these performances through compositional balance is an important step in formulation development of renewable ester based dielectric fluids.

Some drawbacks of renewable ester based dielectric fluids relate to viscosity, pour point, compatibility, stability and usage in power transformers as discussed further below.

High viscosity: most of the renewable ester based dielectric fluids in the market have higher viscosity (8 cSt~9 cSt at 100° C.) than mineral oil based dielectric fluids (2 cSt~3 cSt at 100° C.). Since viscosity has significant impact on heat dissipation by convection in a liquid medium, when other parameters are comparable such as specific heat and thermal conductivity, higher viscosity translates into poorer performance as a cooling fluid. For example, when a 30 kVA class transmission transformer unit (designed for mineral oil based dielectric fluid) is filled with renewable ester based dielectric fluids, it typically shows 12~14° C. higher liquid temperature during operation than when the same unit is filled with mineral oil based dielectric fluid. Therefore, effective usage of renewable ester based dielectric fluids requires physical change in design and construction of transformer units.

Poor pour point: most of the renewable ester based dielectric fluids in the market have higher pour point (−18° C.~−17° C.) than mineral oil based dielectric fluids (−60° C.~−40° C.). Dielectric fluids and base oils may gel (form a soft solid) when left undisturbed even at 15° C. to 20° C. higher than their pour point. For example, fluids with a pour point of −17° C. require special cold starting procedures to avoid failure of mechanical accessories and insulation degradation when left at 0° C., or below, for extended periods of time due to the possibility of gel formation. Handling instructions for typical renewable ester based dielectric fluids contain warnings such as, "May solidify after prolonged exposure to sub-zero temperatures."

Compatibility: renewable ester dielectric fluids are not compatible with standard mineral oil material handling and operational standards due to the ester dielectric fluid's tendency to attract water, solubilize deposits, and become inherently unstable in the presence of oxygen. Also, ester based dielectric fluids have different material compatibility from mineral oil based dielectric fluids due to structural differences in chemistry. For example, nitrile gaskets immersed in renewable ester fluid may shrink (~5%) while they swell (~5%) in mineral oil based dielectric fluid.

Stability: renewable esters are unstable in the presence of air (specifically oxygen) and tend to polymerize over time. Due to such vulnerability many efforts have been put to design transformers with air-tight-seals and limit their usage to non-free breathing applications. Also, due to such vulnerability, special handling and care are required to avoid exposure of the fluids to the air which, in turn, makes it difficult to recycle the fluids.

Power Transformers: Due to many differences between ester based dielectric fluids and mineral oil based dielectric fluids, in both performance parameters and fundamental chemical structures, using renewable esters in power transformers designed for mineral oil based dielectric fluid is not straight forward. For example, typical break down voltage under impulse conditions (measured using ASTM-D3300-12 method) of renewable esters is in the range of 160-170 kV while mineral oils report >300 kV. Also, due to their higher viscosity and higher relative permittivity (dielectric constant), renewable ester based dielectric fluids may experience higher thermal stress and higher electrical stress than mineral oil based fluids, which may cause adverse effects on functionality and long-term drain interval.

There continues to be a need for biodegradable dielectric fluids that have excellent oxidative stability and good environmental performance (i.e., renewability, nontoxicity, and/or biodegradability) as well as good performance properties (such as high flash point, good heat capacity, good thermal conductivity, excellent impulse breakdown strength, and low temperature fluidity, which are equal to or better than those of mineral oil based dielectric fluids.

Among the various aspects of the present disclosure may be noted a dielectric fluid or coolant for electrical apparatuses comprising a biobased hydrocarbon base oil having a molecular weight greater than 300 g/mol and less than 595 g/mol. In one exemplary embodiment, the biobased hydrocarbon base oil has a molecular weight of about 390 g/mol to 510 g/mol.

Another aspect of the present disclosure is a dielectric fluid or coolant for electrical apparatuses comprising a biobased base oil having a molecular weight greater than 300 g/mol and less than 595 g/mol, and a power factor at 25° C. less than 0.01% as measured by ASTM-D924-08. In one exemplary embodiment, the biobased hydrocarbon base oil has a molecular weight of about 390 g/mol to 510 g/mol.

A further aspect of the present disclosure is a dielectric fluid or coolant for electrical apparatuses comprising a biobased hydrocarbon base oil having a molecular weight greater than 300 g/mol and less than 595 g/mol and an oxidative stability of at least 500 minutes as measured by ASTM-D2112-01a. In one exemplary embodiment, the dielectric fluid has an oxidative stability of at least 600 minutes as measured by ASTM-D2112-01a. In one exemplary embodiment, the dielectric fluid has an oxidative stability of at least 700 minutes as measured by ASTM-D2112-01a.

Another aspect of the present disclosure is a dielectric fluid or coolant for electrical apparatuses comprising a biobased base oil with renewable hydrocarbon content greater than 25%, as measured by ASTM-D6866-12 method, and wherein the dielectric fluid provides improved life expectancy and overloading as compared to other dielectric fluids having the same viscosity due to combination of following properties: (a) specific heat greater than 2.3 J/g° K at 60° C.; (b) thermal conductivity greater than 0.142 W/m ° K at 50° C.; (c) an oxidative stability greater than 500 minutes as measured by ASTM-D2112-01a method; or (d) a combination thereof.

Another aspect of the present disclosure is a dielectric fluid or coolant for electrical apparatuses comprising a biobased base oil having the molecular structure $[B]_n$-$[P]_m$ where [B] is biobased hydrocarbon repeating unit; [P] is non-biobased hydrocarbon repeating unit; n is non-zero positive integer, m is non-zero positive integer; the stereoscopical arrangement of [B] and [P] repeating unit can be linear, branched, or cyclic; and the sequential arrangement of [B] and [P] can be block, random, or alternating order.

A further aspect of the present disclosure is a dielectric fluid comprising a gassing tendency modifier for a dielectric fluid for use in a transformer or similar electrical apparatus, wherein gassing tendency modifier comprises a non-saturated olefin which imparts to the fluid a gassing tendency of less than about 10 μl/min as determined by ASTM D2300-08.

A further aspect of the present disclosure is a dielectric fluid or coolant for electrical apparatuses comprising a biobased base oil having the molecular structure: $[B]_n$-$[P]_m$ where [B] is biobased repeating unit; [P] is non-biobased hydrocarbon repeating unit; n is greater than 1, m is less than 4; the stereoscopical arrangement of [B] and [P] repeating unit can be linear, branched, or cyclic; the sequential arrangement of [B] and [P] can be block, random, or alternating order; the molecular weight is in range of 300 g/mol to 595 g/mol; the biobased content is greater than 25%, as measured by ASTM-D6866-12 method; and the fluid has a dielectric impulse breakdown voltage greater than 270 kV as measured by ASTM-D3300-12 method and a power factor at 25° C. less than 0.01% as measured by ASTM-D924-08. In one such embodiment A further aspect of the present disclosure is a method for increasing the power output of a transformer or other electrical apparatus comprising insulating and/or cooling at least some of the electrical apparatus components with a biobased oil dielectric fluid having at least one of the following properties: (a) a dielectric impulse breakdown voltage greater than 270 kV as measured by ASTM-D3300-12 method; (b) a power factor at 25° C. less than 0.01% as measured by ASTM-D924-08; (c) specific heat greater than 2.3 J/g° K at 60° C.; and (d) thermal conductivity greater than 0.142 W/m ° K at 50° C.; or (e) a combination thereof. In one such embodiment, the dielectric fluid has a dielectric impulse breakdown voltage greater than 300 kV as measured by ASTM-D3300-12 method.

A further aspect of the present disclosure is a device selected from the group consisting of a transformer, a capacitor, a switch, a regulator, a circuit breaker, a recloser, a fluid-filled transmission line, and combinations thereof comprising a dielectric fluid with a gassing-tendency modifier selected from the group consisting of: di-hydronaphthalene compounds; tetra-hydronaphthalene compounds; alkylated hydronaphthalene compounds; alkylated tetrahydronaphthalenes; dihydrophenanthrenes; phenyl ortho xylyl ethanes; alkylated benzenes; tetrahydro-5-(1-phenylethyl)-naphthalene; acenapthenes; tetrahydronaphthalenes; alkylated tetrahydronaphthalenes; tetrahydroquinolines; olefinic hydrocarbons; and combinations thereof, wherein the amount of the gassing tendency modifier in the dielectric fluid is less than about 15%.

A further aspect of the present disclosure is a device selected from the group consisting of A device selected from the group consisting of a transformer, a capacitor, a switch, a regulator, a circuit breaker, a recloser, a fluid-filled transmission line, and combinations thereof comprising a dielectric fluid with a gassing tendency modifier comprising a non-saturated olefin which imparts to the fluid a gassing tendency of less than about 10 μl/min as determined by ASTM D2300-08.

A further aspect of the present disclosure is a device selected from the group consisting of a transformer, a capacitor, a switch, a regulator, a circuit breaker, a recloser, a fluid-filled transmission line, and combinations thereof comprising a dielectric fluid comprising a biobased base oil having a molecular weight greater than 300 g/mol and less than 595 g/mol.

A further aspect of the present disclosure is a device selected from the group consisting of a transformer, a capacitor, a switch, a regulator, a circuit breaker, a recloser, a fluid-filled transmission line, and combinations thereof comprising a dielectric fluid comprising a biobased base oil content greater than 25%, as measured by ASTM-D6866-12 method, and wherein the dielectric fluid has both of the following properties (a) and (b): (a) a dielectric impulse breakdown voltage greater than 270 kV as measured by ASTM-D3300-12 method; (b) a power factor at 25° C. less than 0.01% as measured by ASTM-D924-08, and one or more of the properties of (c) through (f): (c) a biodegradability as measured by OECD 301B-28 days greater than 60%; (d) a flash point greater than 150° C., in the range of about 170 to about 230° C.; (e) a pour point lower than or in the range of −40 to −54° C.; and (f) an oxidative stability greater than 500 minutes as measured by ASTM-D2112-01a method.

A device selected from the group consisting of a transformer, a capacitor, a switch, a regulator, a circuit breaker, a recloser, a fluid-filled transmission line, and combinations thereof comprising a biobased dielectric fluid having a molecular weight greater than 300 g/mol and less than 595 g/mol such that the biobased base oil content of the dielectric fluid is greater than 25%, as measured by ASTM-D6866-12 method.

DETAILED DESCRIPTION

Figure 1:
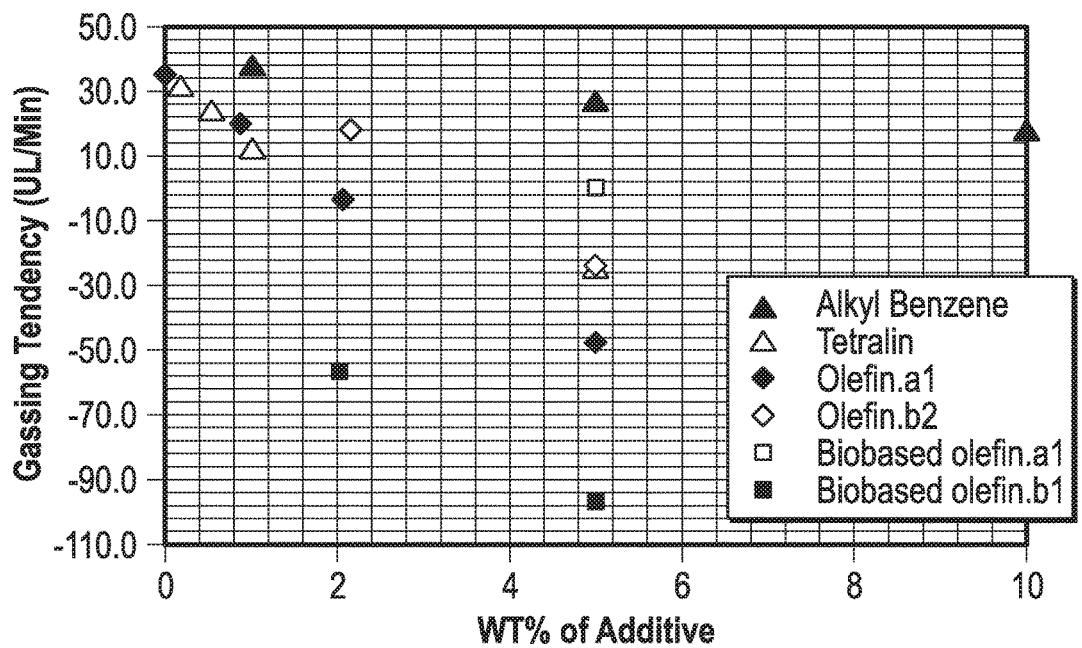
FIG. 1 is a plot of the gassing tendency of various dielectric fluids having different base oils as a function of concentration (by weight percentage) of gassing tendency modifier in the fluids.

Base oils, and more particularly isoparaffins, derived from biobased hydrocarbon terpenes such as myrcene, ocimene and farnesene, have been described in PCT Patent Application No. PCT/US2012/024926, entitled "Base Oils and Methods for Making the Same," filed, Feb. 13, 2012 and published as WO 2012/141784 on Oct. 18, 2012, by Nicholas Ohler, et al., and assigned to Amyris, Inc. in Emeryville, Calif. These base oils have been stated to have utility as lubricant base stocks.

WO 2012/141784 discloses that terpenes are capable of being derived from isopentyl pyrophosphate or dimethylallyl pyrophosphate and the term "terpene" encompasses hemiterpenes, monoterpenes, sesquiterpenes, diterpenes, sesterterpenes, triterpenes, tetraterpenes and polyterpenes. A hydrocarbon terpene contains only hydrogen and carbon atoms and no heteroatoms such as oxygen, and in some embodiments has the general formula $(C_5H_8)_n$, where n is 1 or greater. A "conjugated terpene" or "conjugated hydrocarbon terpene" refers to a terpene comprising at least one conjugated diene moiety. The conjugated diene moiety of a conjugated terpene may have any stereochemistry (e.g., cis or trans) and may be part of a longer conjugated segment of a terpene, e.g., the conjugated diene moiety may be part of a conjugated triene moiety. Hydrocarbon terpenes also encompass monoterpenoids, sesquiterpenoids, diterpenoids, triterpenoids, tetraterpenoids, and polyterpenoids that exhibit the same carbon skeleton as the corresponding terpene but have either fewer or additional hydrogen atoms than the corresponding terpene, e.g., terpenoids having 2 fewer, 4 fewer, or 6 fewer hydrogen atoms than the corresponding terpene, or terpenoids having 2-additional 4-additional, or 6-additional hydrogen atoms than the corresponding terpene. Some non-limiting examples of conjugated hydrocarbon terpenes include isoprene, myrcene, α-ocimene, β-ocimene, α-farnesene, β-farnesene, β-springene, geranylfarnesene, neophytadiene, cis-phyta-1,3-diene, trans-phyta-1,3-diene, isodehydrosqualene, isosqualane precursor I, and isosqualane precursor II. The terms terpene and isoprenoids may be used interchangeably and are a large and varied class of organic molecules that can be produced by a wide variety of plants and some insects. Some terpenes or isoprenoid compounds can also be made from organic compounds such as sugars by microorganisms, including bioengineered microorganisms, such as yeast. Because terpenes or isoprenoid compounds can be obtained from various renewable sources, they are useful monomers for making eco-friendly and renewable base oils. In some embodiments, the conjugated hydrocarbon terpenes are derived from microorganisms using a renewable carbon source, such as a sugar.

Further processing of certain of such biobased base oilstocks has been found to yield highly useful dielectric fluids. For example, C15 hydrocarbons containing four double bonds such as Biofene™ β-farnesene, commercially available from Amyris, Inc. in Emeryville, Calif., may be pretreated to eliminate impurities and then hydrogenated so that three of the four double bonds are reduced to single bonds. The partially hydrogenated intermediate product is then subjected to an oligomerization reaction with a linear alpha olefin (LAO) using a catalyst such as BF3 or a BF3 complex. A further intermediate product, consisting of a mixture of hydrocarbons ranging from C10 to about C75, results. This oligomeric mixture of hydrocarbons is then hydrogenated to reduce the amount of unsaturation. The saturated hydrocarbon mixture is then distilled to obtain the targeted composition and finally blended to meet desirable base oil product specifications for the dielectric fluid. Desirable examples of oil product specifications for one embodiment are set forth in Table 3. In some embodiments in this disclosure, a commercially available biobased hydrocarbon base oil called "Partially hydrogenated β-3,7,11-trimethyldodeca-1, 3,6,10-tetraene, reaction products with linear C8-C16 alpha olefin, hydrogenated" (REACH registration number 01-2120031429-59-0000, commercially available from Novvi LLC, California, United States) is used.

TABLE 3

Example Biobased Base Oil Specifications

| Properties | Method | 3 cSt base oil | 4 cSt base oil | 7 cSt base oil | 15 cSt base oil |
|---|---|---|---|---|---|
| Appearance | Visual | Bright and Clear | Bright and Clear | Bright and Clear | Bright and Clear |
| Color | ASTM D1500 | 0.5 | 0.5 | 0.5 | 0.5 |
| Density, 15° C. (kg/l) | ASTM D4052 | 0.82 | 0.82 | 0.82 | 0.82 |
| Viscosity, 40° C. (cSt) | ASTM D445-14a | 12.5 | 19.2 | 46.1 | 134.7 |
| Viscosity, 100° C. (cSt) | ASTM D445-14a | 3.1 | 4.2 | 7.5 | 15.2 |
| Viscosity Index | ASTM D445-14a | 110 | 124 | 126 | 116 |
| Pour point (° C.) | ASTM D97-12 | −60 | −42 | −51 | −42 |
| Avg. MW (g/mol) | | 378 | 420 | 567 | 756 |
| Flash point (° C.) | ASTM D92-12b | 188 | 226 | 254 | 280 |
| Fire point (° C.) | ASTM D92-12b | 218 | 240 | 288 | 304 |

This base oil may be considered, and also called, one example of a biobased hydrocarbon base oil of the present disclosure. In preparing a dielectric fluid with the biobased hydrocarbon base oil, about 20 weight percent (wt %) up to about 100 wt % of the biobased hydrocarbon base oil may be used. To this biobased hydrocarbon oil may be added between about 1 ppm to about 20 wt % additives, namely one or more antioxidants, metal deactivators, pour point depressant, and/or gassing-tendency modifiers for a dielectric fluid formulation. A blend component comprising one or more oils or liquids may also be used as the base oil to formulate or complete the dielectric fluid, or to adjust the viscosity of the fluid or some other desired characteristic. Such additive oils or liquids may be selected from one or more of the following: microbial oils, vegetable oils, seed oils, mineral oils, isoparaffinic hydrocarbon fluids, silicone fluids, synthetic esters, poly alpha olefins, polysiloxanes, pentaerythritol esters, poly(butane) liquids and combinations thereof. The particular additives and the quantity of each used are selected with desired performances and intended use in mind. Other biobased oils may be used as a base oil in a similar manner, with attention to viscosity as with the biobased hydrocarbon base oil.

As used herein, biobased base oil is understood to mean any biologically derived oil to be used as a base oil in a dielectric fluid. Such oils may be made, for nonlimiting example, from biological organisms designed to manufacture specific oils, as discussed in PCT Patent Application No. PCT/US2012/024926, published as WO 2012/141784, cited above, but do not include petroleum distilled or processed oils such as for non-limiting example mineral oils. A suitable method to assess materials derived from renewable resources is through ASTM D6866-12, "Standard Test Methods for Determining the Biobased Content of Solid, Liquid, and Gaseous Samples Using Radiocarbon Analysis." Counts from $^{14}$C in a sample can be compared directly or through secondary standards to SRM 4990C. A measurement of 0% $^{14}$C relative to the appropriate standard indicates carbon originating entirely from fossils (e.g., petroleum based). A measurement of 100% $^{14}$C indicates carbon originating entirely from modern sources. See, e.g., WO 2012/141784, incorporated herein by reference.

Advantageously, in certain embodiments, at least about 20% of the carbon atoms in the base oil comprised by a dielectric fluid originate from renewable carbon sources. For example, in one such embodiment at least about 30% of the carbon atoms in the base oil comprised by a dielectric fluid originate from renewable carbon sources. By way of further example, in one such embodiment at least about 40% of the carbon atoms in the base oil comprised by a dielectric fluid originate from renewable carbon sources. By way of further example, in one such embodiment at least about 50% of the carbon atoms in the base oil comprised by a dielectric fluid originate from renewable carbon sources. By way of further example, in one such embodiment at least about 60% of the carbon atoms in the base oil comprised by a dielectric fluid originate from renewable carbon sources. By way of further example, in one such embodiment at least about 70% of the carbon atoms in the base oil comprised by a dielectric fluid originate from renewable carbon sources. By way of further example, in one such embodiment at least about 80% of the carbon atoms in the base oil comprised by a dielectric fluid originate from renewable carbon sources. By way of further example, in one such embodiment at least about 90% of the carbon atoms in the base oil comprised by a dielectric fluid originate from renewable carbon sources. In some variations, the carbon atoms of the base oil component of the dielectric fluid comprises at least about 95%, at least about 97%, at least about 99%, or about 100% of originate from renewable carbon sources. The origin of carbon atoms in the reaction product adducts may be determined by any suitable method, including but not limited to reaction mechanism combined with analytical results that demonstrate structure and/or molecular weight of adducts, or by carbon dating (e.g., according to ASTM D6866-12 "Standard Test Methods for Determining the Biobased Content of Solid, Liquid, and Gaseous Samples Using Radiocarbon Analysis," which is incorporated herein by reference in its entirety). For example, using ASTM D6866-12 or another suitable technique, a ratio of carbon 14 to carbon 12 isotopes in the biobased base oil can be measured by liquid scintillation counting and/or isotope ratio mass spectroscopy to determine the amount of modern carbon content in the sample. A measurement of no modern carbon content indicates all carbon is derived from fossil fuels. A sample derived from renewable carbon sources will indicate a concomitant amount of modern carbon content, up to 100%

In some embodiments of this disclosure, one or more repeating units of a biobased hydrocarbon base oil is a specific species of partially hydrogenated conjugated hydrocarbon terpenes. Such specific species of partially hydrogenated conjugated terpenes may or may not be produced by a hydrogenation process. In certain variations, a partially hydrogenated hydrocarbon terpene species is prepared by a method that includes one or more steps in addition to or other than catalytic hydrogenation.

Non-limiting examples of specific species partially hydrogenated conjugated hydrocarbon terpenes include any of the structures provided herein for dihydrofarnesene, tetrahydrofarnesene, and hexahydrofarnesene; any of the structures provided herein for dihydromyrcene and tetrahydromyrcene; and any of the structures provided herein for dihydroocimene and tetrahydroocimene.

One example of a particular species of partially hydrogenated conjugated hydrocarbon terpene that may have utility as a feedstock is a terminal olefin having a saturated hydrocarbon tail with structure (A11):

(A11)

where n=1, 2, 3, or 4.

In some variations, a mono-olefinic alpha-olefin having structure A11 may be derived from a conjugated hydrocarbon terpene wherein the conjugated diene is at the 1,3-position of the terpene. Examples include alpha-olefins derived from a 1,3-diene conjugated hydrocarbon terpene (e.g., a C10-C30 conjugated hydrocarbon terpene such as farnesene, myrcene, ocimene, springene, geranylfarnesene, neophytadiene, trans-phyta-1,3-diene, or cz's-phyta-1,3-diene). Another non-limiting example of an alpha-olefin having the general structure A11 includes 3,7,11-trimethyldodecene having structure A12.

(A12)

A mono-olefinic alpha-olefin having structure A11 may be prepared from the appropriate conjugated hydrocarbon terpene using any suitable method. In some variations, the mono-olefinic alpha-olefin having structure A11 is produced from primary alcohol of corresponding to the hydrocarbon terpene (e.g., farnesol in the case of farnesene, or geraniol in the case of myrcene). The methods comprise hydrogenating the primary alcohol, forming a carboxylic acid ester or carbamate ester from the hydrogenated alcohol, and pyrolizing the ester (or heating the ester to drive the elimination reaction) to form the alpha-olefin with a saturated hydrocarbon tail, e.g., as described in Smith, L. E.; Rouault, G. F., J. Am. Chem. Soc. 1943, 65, 745-750, for the preparation of 3,7-dimethyloctene, which is incorporated by reference herein in its entirety. The primary alcohol of the corresponding hydrocarbon terpene may be obtained using any suitable method.

Alpha-olefins having the general structure A11 from conjugated hydrocarbon terpenes may be prepared via other schemes. For example, in some variations, the hydrocarbon terpene has a conjugated diene at the 1,3-position, and the conjugated diene can be functionalized with any suitable protecting group known to one of skill in the art in a first step (which may comprise one reaction or more than one reaction). The remaining olefinic bonds can be saturated in a second step (which may comprise one reaction or more than one reaction), and the protecting group can be eliminated to produce an alpha-olefin having the general structure A11 in a third step (which may comprise one reaction or more than one reaction).

Any suitable protecting group and elimination scheme may be used. For example, a hydrocarbon terpene having a 1,3-conjugated diene (e.g., β-farnesene) may be reacted with an amine (e.g., a dialkyl amine such as dimethylamine or diethylamine) in the first step to produce an amine having the formula $N(R_1)(R_2)(R_3)$, where $R_1$ and $R_2$ are alkyl groups such as methyl or ethyl, and $R_3$ is an unsaturated hydrocarbon originating from the conjugated terpene. In the case of β-farnesene, $R_3$ is

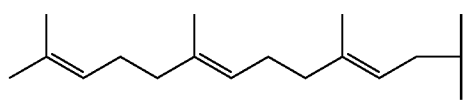 [SMILES: CC(C)=CCC/C(C)=C/CC/C(C)=C/CC(C)C]

The resulting amine may be oxidized to the N oxide using hydrogen peroxide followed by elimination to the aldehyde using acetic anhydride. Hydrogenation of the aldehyde in the presence of a catalyst may be carried out to saturate any remaining olefinic bonds on the aliphatic tail originating from the hydrocarbon terpene, and the aldehyde functionality may be eliminated to produce an alpha-olefin having structure A11. Scheme I below illustrates an example of such a preparation of an alpha-olefin having structure A11 using β-farnesene as a model compound.

Scheme I

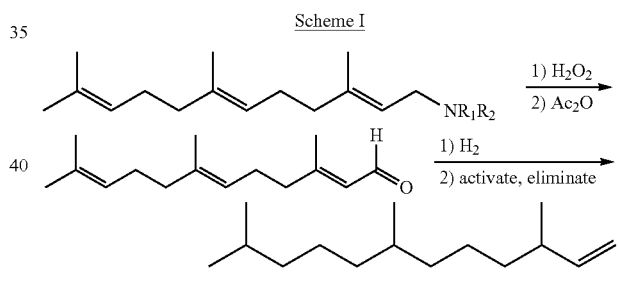

Another variation of a method to make an alpha-olefin from a hydrocarbon terpene having a 1,3-conjugated diene follows Scheme II below. Here, the hydrocarbon terpene is reacted with a dialkyl amine (e.g., dimethylamine). The resulting amine has the general formula $N(R_1)_2(R_2)$, where $R_1$ and $R_2$ are alkyl groups such as methyl and $R_3$ is an unsaturated hydrocarbon originating from the hydrocarbon terpene (e.g., in the cast of β-farnesene, $R_3$ is

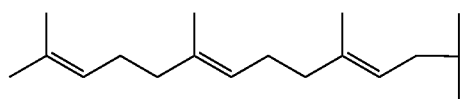

The amine $N(R_1)(R_2)(R_3)$ can be hydrogenated (e.g., using an appropriate catalyst), treated with peroxide, and heated to undergo elimination to form an alpha-olefin having structure A11 (e.g., compound A12 if β-farnesene is used as the starting hydrocarbon terpene). Scheme II illustrates this method using β-farnesene as a model compound.

Scheme II

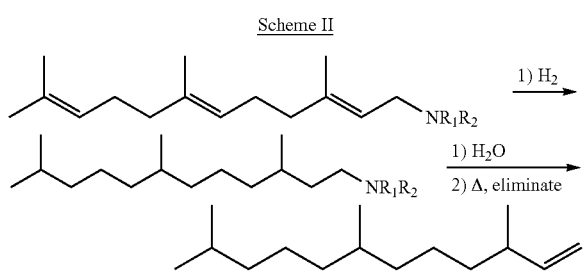

In another variation, a hydrogenated primary alcohol corresponding to a hydrocarbon terpene (e.g., hydrogenated farnesol or hydrogenated geraniol) can be dehydrated using basic aluminum oxide (e.g., at a temperature of about 250° C.) to make an alpha-olefin having the general structure A11. Any suitable dehydration apparatus can be used, but in some variations, a hot tube reactor (e.g., at 250° C.) is used to carry out a dehydration of a primary alcohol. In one variation, hydrogenated farnesol can be dehydrated using basic aluminum oxide (e.g., in a hot tube reactor at 250° C.) to make compound A12, or an isomer thereof.

Other examples of particular species of partially hydrogenated conjugated hydrocarbon terpene that may have utility as a feedstock are mono-olefins having a saturated hydrocarbon tail with structure (A13) or structure (A15):

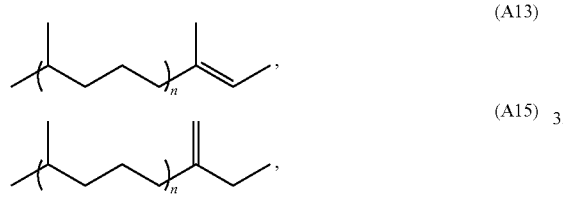

(A13)

(A15)

where n=1, 2, 3, or 4. A mono-olefin having the general structure A13, A15 or A11 may in certain instances be derived from a conjugated hydrocarbon terpene having a 1,3-diene moiety, such as myrcene, farnesene, springene, geranylfarnesene, neophytadiene, trans-phyta-1,3-diene, or cis-phyta-1,3-diene. Here again, the conjugated may be functionalized with a protecting group (e.g., via a Diels-Alder reaction) in a first step, exocyclic olefinic bonds hydrogenated in a second step, and the protecting group eliminated in a third step. In one non-limiting example of a method for making mono-olefins having the structure A13, A15 or A11, a conjugated hydrocarbon terpene having a 1,3-diene is reacted with $SO_2$ in the presence of a catalyst to form a Diels-Alder adduct. The Diels-Alder adduct may be hydrogenated with an appropriate hydrogenation catalyst to saturate exocyclic olefinic bonds. A retro Diels-Alder reaction may be carried out on hydrogenated adduct (e.g., by heating, and in some instances in the presence of an appropriate catalyst) to eliminate the sulfone to form a 1,3-diene. The 1,3-diene can then be selectively hydrogenated using a catalyst known in the art to result in a mono-olefin having structure A11, A13 or A15, or a mixture of two or more of the foregoing. Non-limiting examples of regioselective hydrogenation catalysts for 1,3-dienes are provided in Jong Tae Lee et al, "Regioselective hydrogenation of conjugated dienes catalyzed by hydridopentacyanocobaltate anion using β-cyclodextrin as the phase transfer agent and lanthanide halides as promoters," *J. Org. Chem.*, 1990, 55 (6), pp. 1854-1856, in V. M. Frolov et al, "Highly active supported palladium catalysts for selective hydrogenation of conjugated dienes into olefins," Reaction Kinetics and Catalysis Letters, 1984, Volume 25, Numbers 3-4, pp. 319-322, in Tungler, A., Hegedus, L., Fodor, K., Farkas, G., Furcht, A. and Karancsi, Z. P. (2003) "Reduction of Dienes and Polyenes," in *The Chemistry of Dienes and Polyenes*, Volume 2 (ed. Z. Rappoport), John Wiley & Sons, Ltd, Chichester, UK. doi: 10.1002/0470857226.ch12, and in Tungler, A., Hegedus, L., Fodor, K., Farkas, G., Furcht, A. and Karancsi, Z. P., "Reduction of Dienes and Polyenes" in *Patai's Chemistry of Functional Groups* (John Wiley and Sons, Ltd, published online Dec. 15, 2009, DOI: 10.1002/9780470682531.pat0233), each of which is incorporated herein by reference in its entirety. For example, a catalyst known in the art for 1,4 hydrogen addition to 1,3-dienes results in a mono-olefin having structure A13. In one non-limiting example, β-farnesene can be reacted with $SO_2$ in the presence of a catalyst to form a Diels-Alder adduct, which is subsequently hydrogenated, and the sulfone eliminated to form a 1,3-diene, which is subsequently selectively hydrogenated using a catalyst known in the art for regioselective hydrogen additions to 1,3-dienes to form 3,7,1 I-trimethyldodec-2-ene, 3,7,11-trimethyldodec-1-ene, or 3-methylene-7,11-dimethyldodecane, or a mixture of any two or more of the foregoing.

In yet another example of a particular species of partially hydrogenated hydrocarbon terpene that may have utility as a feedstock, a terminal olefin of the general structure A14 may be made from a conjugated hydrocarbon terpene having a 1,3-conjugated diene and at least one additional olefinic bond (e.g., myrcene, farnesene, springene, or geranylfarnesene):

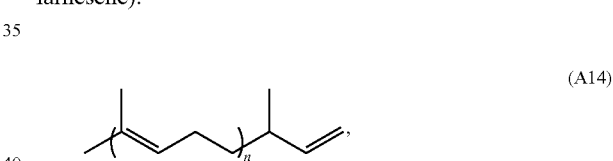

(A14)

where n=1, 2, 3, or 4. In one non-limiting variation, a compound having the structure A14 may be derived from an unsaturated primary alcohol corresponding to the relevant hydrocarbon terpene (e.g., farnesol in the case of farnesene, or geraniol in the case of myrcene). The unsaturated primary alcohol may be exposed to a suitable catalyst under suitable reaction conditions to dehydrate the primary alcohol to form the terminal olefin A 14.

In one non-limiting example, a stoichiometric deoxygenation-reduction reaction may be conducted to form compounds having structure A14 from a primary alcohol (e.g., farnesol or geraniol) of a hydrocarbon terpene. One prophetic example of such a reaction can be conducted according to a procedure described in Dieguez et al, "Weakening C-0 Bonds: Ti(III), a New Reagent for Alcohol Deoxygenation and Carbonyl Coupling Olefination," *J. Am. Chem. Soc.* 2010, vol. 132, pp. 254-259, which is incorporated by reference herein in its entirety: A mixture of titanocene dichloride ($\eta^5$-$C_5H_5$)$_2$TiCl$_2$ (Cp$_2$TiCl$_2$) (3.88 mmol) and Mn dust (2.77 mmol) in strictly deoxygenated tetrahydrofuran (THF) (7 mL) can be heated at reflux under stirring until the red solution turns green. Then, to this mixture can be added a solution of the primary alcohol (e.g., farnesol or geraniol) (1.85 mmol) in strictly deoxygenated THF (4 mL). After the starting materials disappear, the reaction can be quenched with 1N HCl and extracted with tert-butylmethyl ether (t-BuOMe). The organic phase can be washed with brine, filtered and concentrated in vacuo to yield a crude product, which can be purified, e.g., by column chromatography (hexane/t-BuOMe, 8:1) over silica gel column to afford a compound having structure A14 (e.g., 3,7,11-trimethyldodeca-1,6,10-triene if farnesol is used as the starting material).

Other reactions may be conducted to form compounds having structure A14 from a primary alcohol (e.g., farnesol or geraniol) of a hydrocarbon terpene. One prophetic example of such a reaction can be conducted according to another procedure described in Dieguez et al, "Weakening C-0 Bonds: Ti(III), a New Reagent for Alcohol Deoxygenation and Carbonyl Coupling Olefination," *J. Am. Chem. Soc.* 2010, vol. 132, pp. 254-259, which is incorporated herein by reference in its entirety: A mixture of $Cp_2TiCl_2$ (0.639 mmol) and Mn dust (17.04 mmol) in thoroughly deoxygenated THF (8 mL) and under Ar atmosphere can be stirred until the red solution turned green. This mixture may then be heated at reflux and the corresponding trimethylsilylchloride (TMSCl) (8.52 mmol) may be added. The primary alcohol (e.g., farnesol) (1.92 mmol) in strictly deoxygenated THF (2 mL) may then be added. After the starting materials disappear, the reaction may be quenched with t-BuOMe, washed with 1 N HCl, brine, dried, and concentrated under reduced pressure. The resulting crude may be purified, e.g., by column chromatography (hexane/t-BuOMe, 8:1) on silica gel to afford compound having structure A14 (e.g., 3,7,11-trimethyldodeca-1,6,10-triene if farnesol is used as the starting material).

An olefinic feedstock as described herein may comprise any useful amount of the particular species (e.g., alpha-olefinic species having structure A11, A12 or A15, mono-olefinic species having structure A13, or unsaturated terminal olefin species having structure A14), made either by a partial hydrogenation route or by another route, e.g., as described herein. In certain variations, an olefinic feedstock comprises at least about 1%, at least about 5%, at least about 10%, at least about 20%, at least about 30%, at least about 40%, at least about 50%, at least about 60%, at least about 70%, at least about 80%, or at least about 90% species having structure A11, A12, A13, A14, or A15. In certain variations, an olefinic feedstock comprises at least about 1%, at least about 5%, at least about 10%, at least about 20%, at least about 30%, at least about 40%, at least about 50%, at least about 60%, at least about 70%, at least about 80%, or at least about 90% 3,7,11-trimethyldodec-1-ene. In certain variations, an olefinic feedstock comprises at least about 1%, at least about 5%, at least about 10%, at least about 20%, at least about 30%, at least about 40%, at least about 50%, at least about 60%, at least about 70%, at least about 80%, or at least about 90% 3-methylene-7,11-dimethyldodecane. In certain variations, an olefinic feedstock comprises at least about 1%, at least about 5%, at least about 10%, at least about 20%, at least about 30%, at least about 40%, at least about 50%, at least about 60%, at least about 70%, at least about 80%, or at least about 90% 3,7,11-trimethyldodec-2-ene. In certain variations, an olefinic feedstock comprises at least about 1%, at least about 5%, at least about 10%, at least about 20%, at least about 30%, at least about 40%, at least about 50%, at least about 60%, at least about 70%, at least about 80%, or at least about 90% 3,7,11-trimethyldodeca-1,6,10-triene. In certain variations, an olefinic feedstock comprises at least about 1%, at least about 5%, at least about 10%, at least about 20%, at least about 30%, at least about 40%, at least about 50%, at least about 60%, at least about 70%, at least about 80%, or at least about 90% 3,7-dimethyloct-1-ene. In certain variations, an olefinic feedstock comprises at least about 1%, at least about 5%, at least about 10%, at least about 20%, at least about 30%, at least about 40%, at least about 50%, at least about 60%, at least about 70%, at least about 80%, or at least about 90% 3,7-dimethyloct-2-ene. In certain variations, an olefinic feedstock comprises at least about 1%, at least about 5%, at least about 10%, at least about 20%, at least about 30%, at least about 40%, at least about 50%, at least about 60%, at least about 70%, at least about 80%, or at least about 90% 3,7-dimethylocta-1,6-diene.

As described herein, in some variations, the hydrocarbon terpene feedstock comprising alpha-olefinic species or internal olefinic species of partially hydrogenated hydrocarbon terpenes are suitable for catalytic reaction with one or more alpha-olefins to form a mixture of isoparaffins comprising adducts of the terpene and the one or more alpha-olefins. In some variations, at least a portion of the mixture of isoparaffins so produced may be used as a base oil.

Esters can be considered a co-base oil or additive depending on the degree of environmental performance for the target of the formulation. Typically there can be a renewability requirement on the amount of renewable carbon contained in the overall formulation. The renewable base oil of the invention can vary in its amount of renewable carbon. To add additional renewable carbon, fatty acids, esters, or other biobased base oils can be considered. Some of these can be forms of Trimethylolpropantrioleates, Triglycerides, Trimethylolpropane esters, Polyl complex esters, 2-Ethylhexyl Cocoate, methyl esters, saturated trimethylolpropane ester, trimethylolpropane ester of carboxylic acids, saturated monopentaerythritol branched acids, trimethylolpropane, and complex esters of carboxylic acids.

In one embodiment, the dielectric fluid formulation comprises an ester or cosolvent. For example, in one such embodiment the dielectric fluid formulation may comprise about 0.1-75% ester or cosolvent. By way of further example, in one such embodiment the dielectric fluid may comprise about 1-70% ester or cosolvent. By way of further example, in one such embodiment the dielectric fluid may comprise about 3-20% ester or cosolvent. In each of these embodiments, the ester or cosolvent additive may be a single ester or cosolvent or it may comprise a combination of ester or cosolvent. Further, in each of these embodiments, the ester or cosolvent may be selected from among the following compositions (and included as a co-base oil or an additive):

(i) esters made by dehydration of mono-acids, di-acids, tri-acids with alcohols with mono-, di- or multi-alcohols. Preferred acids include C4-C30 monobasic acids, more preferably 2-ethylhexanoic acid, isoheptyl, isopentyl, and capric acids, and di-basic acids, more preferably adipic, fumaric, sebacic, azelaic, maleic, phthalic, and terephthalic acids, dimerized and trimerized fatty acids. The alcohols can be any of the suitable mono-alcohols or polyols. Preferred examples are glycerol, 2-ethylhexanol, iso-tridecanols, neopentyl glycol, trimethylol ethane, 2-methyl-2-propyl-1,3-propanediol, trimethylol propane, pentaerythritol, and dipentaerythritol, ethoxylated, propoxylated and butoxylated alcohols; and (ii) alkylbenzenes and other alkyl aromatics such as alkylnaphthalenes The performance advantages of synthetic dielectric fluids made with biobased base oils of this disclosure, including for non-limiting examples embodiments employing biobased hydrocarbon base oils, changes the overall concept of using oil in dielectric fluids. With the present disclosure, high performance can be obtained while still providing environmental compatibility. The dielectric fluids of this disclosure, when used in transformers, can extend the useful life of the transformers. Additionally, transformers can be designed to be more compact, requiring the need for less oil, because the dielectric fluids of this disclosure provide for more efficient cooling and insulation.

Further, the synthetic dielectric fluids made with biobased base oils of this disclosure are compatible with commercially available dielectric fluids currently in use in transformers. This compatibility enables the fluids of the disclosure to provide equivalent or better performance in a power transformer than a mineral oil product or other traditional petroleum products while being both renewable and biodegradable.

Additionally, the synthetic dielectric fluids made with biobased base oils of this disclosure can have a very long product life (e.g., 40 years or more) due to their stability and can be reconditioned and put back in use for an even longer time, helping the environment and reducing costs.

In formulating the synthetic dielectric fluids of this disclosure, according to one embodiment of this disclosure, the dielectric fluid composition comprises an anti-oxidant. Antioxidants are typically free-radical traps, acting as free-radical reaction chain breakers. That is, effective antioxidants may be selected from radical scavengers such as phenolic, aminic antioxidants, or synergistic mixtures of these. Sulfurized phenolic antioxidants and organic phosphites are useful as components of such mixtures. Many antioxidant additives that are known and used in the formulation of lubricant products are suitable for use with the dielectric fluid formulation described in this disclosure. Examples of phenolic antioxidants include 2,6-di-tert-butylphenol, liquid mixtures of tertiary butylated phenols, 2,6-di-tert-butyl-4-methylphenol, 4,4'-methylenebis(2,6-di-tert-butylphenol), 2,2'-methylenebis(4-methyl6-tert-butylphenol), mixed methylene-bridged polyalkyl phenols, 4,4'-thiobis(2-methyl-6-tert-butylphenol), 4,4'-butylidene-bis(3-methyl-6-tert-butylphenol), 4,4'-isopropylidene-bis(2, 6-di-tert-butylphenol), 2,2'-methylene-bis(4-methyl-6-nonylphenol), 2,2'-isobutylidene-bis(4,6-dimethylphenol), 2,6-di-tert-butyl-4-methylphenol, 2,6-di-tert-butyl-4-ethylphenol, 2,4-dimethyl-6-tert-butyl-phenol, 2,6-di-tert-1-dimethylamino-p-cresol, 2,6-di-tert-4-(N,N'-dimethylaminomethylphenol), 4,4'-thiobis(2-methyl-6-tert-butylphenol), 2,2'-thiobis(4-methyl-6-tert-butylphenol), bis(3-methyl-4-hydroxy-5-tert-10-butylbenzyl)-sulfide, bis(3, 5-di-tert-butyl-4-hydroxybenzyl), 2,2'-5-methylene-bis(4-methyl-6-cyclohexylphenol), N,N'-di-sec-butylphenylenediamine, 4-isopropylaminodiphenylamine, phenyl-.alpha.-naphthyl amine, phenyl-.alpha.-naphthyl amine, and ring-alkylated diphenylamines. Examples include the sterically hindered tertiary butylated phenols, bisphenols and cinnamic acid derivatives and combinations thereof. In yet another embodiment, the antioxidant is an organic phosphonate having at least one direct carbon-to-phosphorus linkage. Diphenylamine-type oxidation inhibitors include, but are not limited to, alkylated diphenylamine, phenyl-alpha-naphthylamine, and alkylated-alpha-naphthylamine. Other types of oxidation inhibitors include metal dithiocarbamate (e.g., zinc dithiocarbamate), and 15-methylenebis(dibutyldithiocarbamate). In another embodiment, class of antioxidants suitable for food grade industrial lubricant formulation are also useful in the dielectric fluid described in the current disclosure. Examples of such antioxidants include, without limitation, butylated hydroxyanisole (BHA), di-butyl-paracresol (BHT), phenyl-a-naphthylamine (PANA), octylated/butylated diphenylamine, tocopherol (vitamin-E), β-carotene, sterically hindered alkylthiomethylphenol, Dimethylethyl)-1,4-benzenediol, 1,2-dihydro-2,2,4-trimethylquinoline, ascorbyl palmitate, propyl gallate, high molecular weight phenolic antioxidants, hindered bis-phenolic antioxidant, and mixtures of these.

In one embodiment, such an antioxidant in an amount of 0.01 wt % to ~2 wt % of the dielectric fluid may be added to the biobased base oil and other additive mixture comprising the dielectric fluid described in the current disclosure.

Metal deactivators/passivator may also be used in addition to or as an alternative to an antioxidant. In one embodiment, list of useful metal deactivators include imidazole, benzimidazole, pyrazole, benzotriazole, tolutriazole, 2-methyl benzimidazole, 3,5-dimethyl pyrazole, and methylene bis-benzotriazole. Commercial examples used in some embodiments of the disclosure include, without limitation, triazole derivative metal deactivators, such as Irgamet® 30 (available from BASF), and tolutriazole derivative metal deactivators, such as Irgamet® 39 (available from BASF)

An amount of metal deactivators up to about 100 ppm is used in some embodiments. In one embodiment, the metal passivator is food grade and comply with FDA regulations. One of such useful additive is the N-acyl derivative of sarcosine, such as an N-acyl derivative of sarcosine. One example is N-methyl-N-(1-oxo-9-octadecenyl) glycine. This derivative is commercially available from BASF under the trade name SARKOSYL™ O. Another additive is an imidazoline such as Amine O™, also, commercially available from BASF.

The gassing tendency of a dielectric fluid is determined by applying a 10,000 volt AC. current to two closely spaced electrodes, with one of the electrodes being immersed in the dielectric fluid being tested under a controlled hydrogen atmosphere. The amount of pressure elevation in the controlled atmosphere is an index of the amount of decomposition resulting from the electrical stress that is applied to the fluid. A pressure decrease is indicative of a fluid that is stable under corona forces and is a net absorber of hydrogen. More details of such test method is provided in the ASTM-D2300-08 document known to those of ordinary skill in the art.

Gassing tendency is reported in the rate (microliter per minute) at which gas is evolved (positive gassing) or absorbed (negative gassing). A gassing-tendency modifier is typically blended with a dielectric fluid to suppress the rate of gas evolution. Such suppression of gassing tendency may have an advantage in reducing equipment failures, particularly cables and capacitors.

Typical selection of gassing-tendency modifiers include alkyl substituted or unsubstituted, partially saturated polyaromatic hydrocarbons (e.g., polycyclic aromatic hydrocarbons with some degree of saturation such as tetralin), alkylated one ring aromatic hydrocarbons (e.g., alkylated benzene such as monobenzyl toluene, dibenzyl toluene, and 1,2-dimethyl-4-(1-phenyl-ethyl)-benzene), alklylated polycyclic aromatic hydrocarbons, and their mixtures. Other examples of gassing tendency modifiers include, without limitation, di-hydronaphthalene compounds, tetra-hydronaphthalene compounds, alkylated hydronaphthalene compounds, alkylated tetrahydronaphthalen, dihydrophenanthrene, phenyl ortho xylyl ethene, alkylated benzenes, tetrahydro-5-(1-phenylethyl)-naphthalene), acenaphthene, tetrahydronaphthalene, alkylated tetrahydronaphthalenes, and tetrahydroquinoline. Fully aromatic compounds such as naphthalene may not affect the hydrogen gassing value.

In certain embodiments of this disclosure, a bicyclic, partially saturated, aromatic compound is used for suppressing or depressing gassing tendency. In certain other embodiments, an alklylated benzene compound is used. In still another embodiment, olefins with more than 10 carbons are used as a gassing tendency modifier. In some embodiments, olefins with renewable hydrocarbons, olefins with non-renewable hydrocarbons, and their mixtures may be used. The olefin can be any olefin deemed useful to one of skill in the art. Some useful olefins are described herein. The type, molecular weight, and degree of branching in the olefin co-monomer may be selected based on the desired properties. In some embodiments, the olefin is a terpene. In some embodiments, a non-terpene olefin is linear or lightly branched (e.g., containing 1 or 2 branches). In some embodiments, the olefin comprises one or more alpha-olefins. In some embodiments, the olefin co-monomer comprises one or more C6-C20 alpha-olefins, e.g., one or more C6-C20 linear alpha-olefins. Examples of such olefins include, but are not limited to, hexenes, octenes, decenes, dodecenes, tetradecenes and hexadecanes, C18 olefins C20 olefins, and terpenes as described in International Patent Application No. PCT/US2012/024926, published as WO 2012/141784, cited above, and discussed further below. Partially hydrogenated forms of such olefins may also and alternatively be used. In one example embodiment, the addition of olefins (about 0.5 wt % to about 9 wt %) achieved depression of gassing tendency by 20~130 uL/min (according to the ASTM-D2300-08 method) from the base fluid mixture's gassing evolution rate.

In one embodiment, for example, the amount of non-biobased hydrocarbon base oil in the dielectric fluid may be at least 5 wt % of the dielectric fluid. In general, however, it is presently contemplated that the amount of non-biobased hydrocarbon base oil is less than 45 wt % of the dielectric fluid. For example, in one embodiment the amount of non-biobased hydrocarbon base oil is in the range of about 5 wt % to about 45 wt %. In some embodiments, the amount of non-biobased hydrocarbon base oil is in the range of about 5 wt % to about 36 wt %.

WO 2012/141784 discloses that terpenes are capable of being derived from isopentyl pyrophosphate or dimethylalyl pyrophosphate and the term "terpene" compasses hemiterpenes, monoterpenes, sesquiterpenes, diterpenees, sesterterpenes, triterpenees, tetraterpenes and polyterpenes. A hydrocarbon terpene contains only hydrogen and carbon atoms and no heteroatoms such as oxygen, and in some embodiments has the general formula $(C_5H_8)_n$, where n is 1 or greater. A "conjugated terpene" or "conjugated hydrocarbon terpene" refers to a terpene comprising at least one conjugated diene moiety. The conjugated diene moiety of a conjugated terpene may have any stereochemistry (e.g., cis or trans) and may be part of a longer conjugated segment of a terpene, e.g., the conjugated diene moiety may be part of a conjugated triene moiety. Hydrocarbon terpenes also encompass monoterpenoids, sesquiterpenoids, diterpenoids, triterpenoids, tetraterpenoids, and polyterpenoids that exhibit the same carbon skeleton as the corresponding terpene but have either fewer or additional hydrogen atoms than the corresponding terpene, e.g., terpenoids having 2 fewer, 4 fewer, or 6 fewer hydrogen atoms than the corresponding terpene, or terpenoids having 2 additional 4 additional, or 6 additional hydrogen atoms than the corresponding terpene. Some non-limiting examples of conjugated hydrocarbon terpenes include isoprene, myrcene, α-ocimene, β-ocimene, α-farnesene, β-farnesene, β-springene, geranylfarnesene, neophytadiene, cis-phyta-1,3-diene, trans-phyta-1,3-diene, isodehydrosqualene, isosqualane precursor I, and isosqualane precursor II. The terms terpene and isoprenoids may be used interchangeably and are a large and varied class of organic molecules that can be produced by a wide variety of plants and some insects. Some terpenes or isoprenoid compounds can also be made from organic compounds such as sugars by microorganisms, including bioengineered microorganisms, such as yeast. Because terpenes or isoprenoid compounds can be obtained from various renewable sources, they are useful monomers for making eco-friendly and renewable base oils. In some embodiments, the conjugated hydrocarbon terpenes are derived from microorganisms using a renewable carbon source, such as a sugar.

Table 4 compares the effect of various gassing tendency modifiers at fixed concentrations (5 wt %). Reported gassing tendency was measured using the ASTM-D2300-08 method. Certain biobased hydrocarbon base oil formulations without gassing tendency modifiers showed 35.4 µL/min. A commonly used gassing tendency modifier, tetralin (1,2,3,4-tetrahydronaphthalene), depressed the gassing tendency to 24.9 µL/min. Although tetralin can be effective at modifying gassing tendency, it is known to be toxic to aquatic life with long lasting effects (according to European Directive 67/548/EEC, assigning to tetralin code R51/53). Alkylated benzene also showed some activity in reducing gassing tendency but was not as effective as tetralin. Olefins and their oligomers may serve as effective gassing tendency modifiers while carrying low toxicity to environment. Olefins compared in table 4 (tetradecene, dodecene, and farnesene) show more efficiency in lowering gassing tendency than tetralin. Farnesene dimers and mono unsaturated farnesene show more efficiency in lowering gassing tendency than alkylated benzene. FIG. 1 shows the gassing tendency of various blends as a function of concentration and identity of gassing tendency modifier.

In some embodiments, the gassing tendency modifier is selected from acyclic C10-C30 terpenes. In some embodiments, the terpene is an acyclic C10 terpene, an acyclic C15 terpene, or an acyclic C20 terpene. In some embodiments, the terpene is selected from the group consisting of myrcene, ocimene and farnesene. In some embodiments, the terpene is β-farnesene. In some embodiments, the hydrocarbon terpene feedstock comprises a partially hydrogenated hydrocarbon terpene. The terpene feedstock can be partially hydrogenated according to any method apparent to persons of ordinary skill in the art. In some embodiments, the acyclic olefins are non-terpene olefins and they are linear or lightly branched (e.g., containing 1 or 2 branches). In some other embodiments, the olefin co-monomer is a terpene. In certain embodiments, the olefin co-monomer comprises one or more alpha-olefins. In some embodiments, the olefin co-monomer comprises one or more C6-C20 alpha-olefins, e.g., one or more C6-C20 linear alpha-olefins.

TABLE 4

Gassing Tendency of Blends --base fluid and various additives--(at 5 wt % concentration), measured using ASTM-D2300-08 method

| | gassing tendency (uL/min) |
|---|---|
| no gassing tendency modifier | 35.4 |
| alkylated benzene | 26.9 |

TABLE 4-continued

Gassing Tendency of Blends --base fluid and various additives--(at 5 wt % concentration), measured using ASTM-D2300-08 method

|  | gassing tendency (uL/min) |
|---|---|
| tetralin | −24.9 |
| mono unsaturated dodecene | −47.8 |
| mono unsaturated tetradecene | −25.5 |
| farnesene | −97.1 |
| mono unsaturated farnesene | 0.5 |
| unsaturated farnesene dimers | −1.4 |

The disclosure will be further understood by reference to the following examples which are not to be construed as limiting. Those skilled in the art will appreciate that other and further embodiments are apparent and within the spirit and scope of the claims from the teachings of the examples taken with the accompanying specification.

Biobased base oil dielectric fluids described in the current disclosure exhibit advantageous dielectric properties that compare well with mineral oil (both napthenic and isoparaffinic) based dielectric fluids. This is well demonstrated in data for impulse breakdown voltage and power factor, measured at 25° C., and shown in Table 5. Referring to Table 5, two example formulations of the disclosure employing a biobased hydrocarbon base oil, Exp-BL.1 and Exp-BL.2 fluids, show good low temperature fluidity (low pour point: −40° C.~−54° C.) and have higher flash and fire points than commercially available mineral oil based dielectric fluids. Exp-BL.1 has kinematic viscosity of 4.2 cSt at 100° C. and contains 99.75 wt % biobased base oil and 0.25 wt % of additive(s). Exp-BL.2 has kinematic viscosity of 3.0 cSt at 100° C. and contains 99.74 wt % biobased base oil and 0.26 wt % of additive(s). Exp-BL.1 fluid meets the requirements of specifications set for mineral oil based dielectric fluids except the viscosity requirement, and Exp-BL.2 fluid meets all the requirements of specifications set for mineral oil based dielectric fluids. Both fluids are also compatible with mineral oil and devices designed and constructed to use mineral oil as the dielectric coolant. After use, Exp-BL.1 and Exp-BL.2 fluids can be recycled together with used mineral oil based dielectric fluids without need for pretreatment or separation.

Formulations of this disclosure, such as for nonlimiting example Exp-BL.1 and Exp-BL.2 fluids, have superior oxidative stability as can be seen in the following examples. ASTM-D2112-01a method is designed to test oxidation stability of inhibited mineral insulating oil using a rotating pressure vessel at 140° C. Exp-BL.1 and Exp-BL.2 fluids show a longer stability score with this test method than other dielectric fluids compared in Table 5. Also, oxidative stability under free-breathing (open to air) conditions at an elevated temperature (120° C.) was tested with 20 g of samples charged in a vial with a freshly resurfaced copper strip. Results are shown in FIG. 2.

Figure 2:
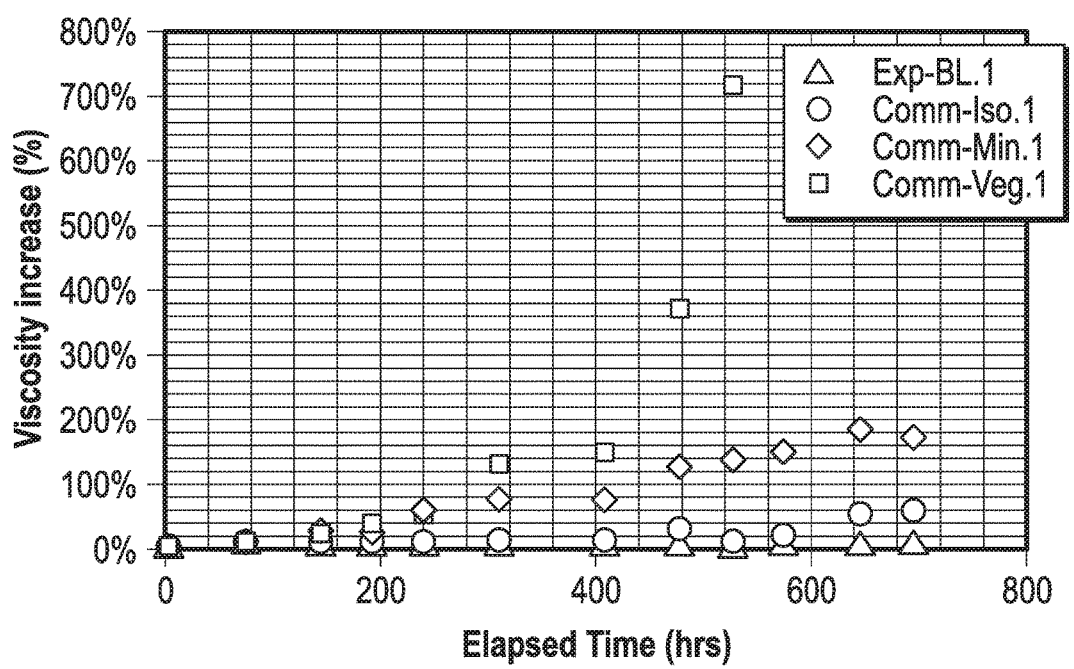
FIG. 2 is a plot comparing the oxidation stability of an example dielectric fluid of one embodiment of the present disclosure with the oxidation stability of three different commercially available dielectric fluids, one of which is a commercially available isoparaffin oil based fluid, one a commercially available mineral oil, particularly a naphthalic oil based fluid, and one a vegetable oil, particularly an ester based fluid, measuring the viscosity increase as a function of elapsed time.

Referring to Table 5 and FIG. 2, a commercial vegetable based dielectric fluid, herein also called "Comm-Veg.1" for abbreviation, containing an ester blend base oil, showed more than a 150% increase in viscosity over its fresh sample after 420 hours. A commercial naphthenic oil based dielectric fluid, herein also called "Comm-Min.1" for abbreviation, containing a naphthenic base oil, showed more than 150% increase in viscosity after 560 hours. In contrast, an example formulation of a dielectric fluid of one embodiment of the present disclosure, called Exp-BL.1 herein, comprising a biobased hydrocarbon base oil, showed less than a 10% increase in viscosity throughout the duration of the test (up to 700 hours). At 750 hours duration for an oxidation test, Comm-Min.1 showed about 190% viscosity increase and Comm-Iso.1, another commercial mineral oil based dielectric fluid containing isoparaffin oil instead of naphthenic oil, showed about 60% viscosity increase. Both of these mineral oil samples had heavy precipitation or deposit with a black to brown color. Again, in contrast, at 750 hours, the example formulation of one embodiment of the present disclosure, Exp-BL.1, was still clear liquid (no precipitation or deposit seen) and had less than 10% viscosity increase. A copper strip was immersed in each test fluid and rated according to ASTM-D130 evaluation chart. Copper strips immersed in Comm-Iso.1, Comm-Min.1, and Comm-Min. 2, another commercial mineral oil base dielectric fluid, for the 1000 hours duration of the oxidation test, were rated 4c due to heavy black deposits that covered the entire surface of the copper strips. The copper strip that was immersed in Exp-BL.1 for the same amount of time, 1000 hours, showed only a slight hint of color change and was rated 1a~1b. The copper strip that was immersed in Comm-Veg.1 could not be rated because the fluid solidified after 500 hours duration in the oxidation test at 120° C., making it difficult to remove the strip from the test container. These observations demonstrated the improved oxidative stability of synthetic dielectric fluid made with biobased base oil disclosed herein when compared to commercially available dielectric fluids.

TABLE 5

Some Example Property Differences Among Various Dielectric Fluids

|  | Name | | | | |
|---|---|---|---|---|---|
|  | Exp-BL. 1 | Exp-BL. 2 | Comm-Veg-1. | Comm-Iso-1. | Comm-Min. 1 |
| Molecular composition | biobased hydro-carbon | biobased hydro-carbon | natural ester blends | iso-paraffinic base oil | naph-thenic base oil |
| Impulse breakdown voltage | >300 kV | >300 kV | 168 kV | >300 kV | >300 kV |
| Power factor @ 25° C. | 0.003% | 0.006% | 0.140% | <0.01% | 0.001% |
| Meets the requirements for mineral oil dielectric fluid (i.e. ASTM-D3487) | no (only due to viscosity) | Yes | no | yes | yes |
| Low temperature fluidity (pour point, ° C.) | −40 | −54 | −18 | −60 | −56 |
| Fire Safety (flash point, ° C.) | 228 | 170 | 330 | 170 | 145~155 |
| Compatible with mineral oil* | yes | Yes | no | yes | yes |
| Oxidative Stability (ASTM-D2112-01a) | 800 min | 700 min | 37 min | 600 min | 220 min |
| biodegradability (OECD 301B-28 days, %) | 74 | 80 | 95 | 10~50 | 10~50 |

*Compatibility with mineral oil refers to recyclability of used oil in a current used mineral oil based transformer fluid recycling process and compatibility with materials used in the construction of electrical equipment, such as transformer and fluid filled transmission cable, which are approved for use with mineral oil based dielectric fluids.

Figure 3:
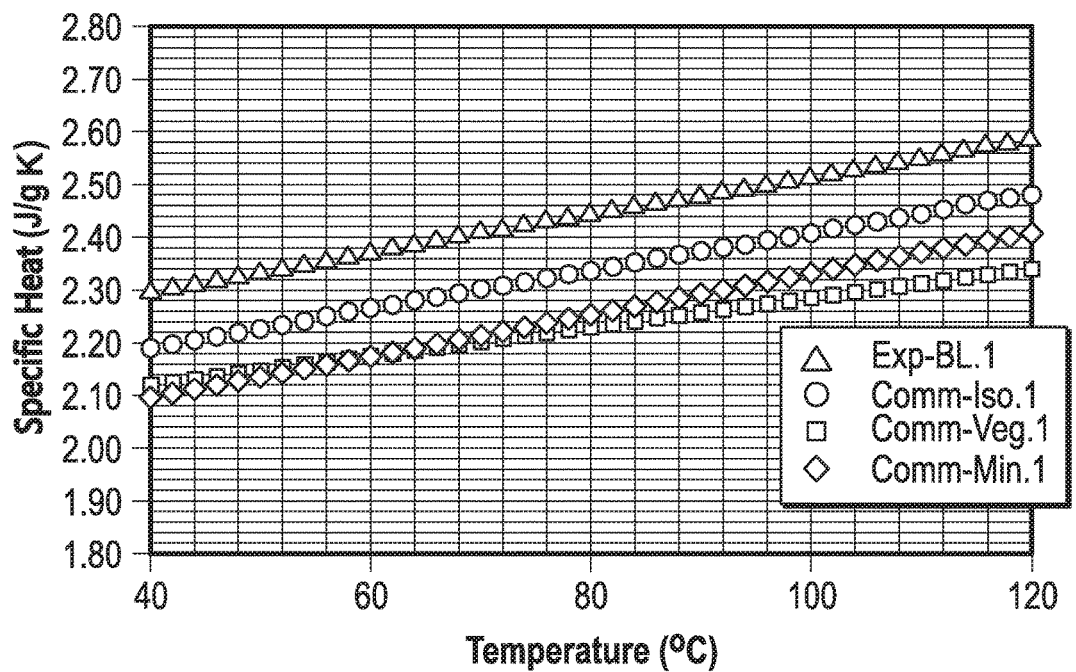
FIG. 3 is a plot comparing the heat capacity of an example dielectric fluid of one embodiment of the present disclosure with the heat capacity of three different commercially available dielectric fluids, one of which is a commercially available isoparaffin oil based fluid, one a commercially available mineral oil, particularly a naphthalic oil based fluid, and one a vegetable oil, particularly an ester based fluid.

The heat transfer capability of fluids can be compared using specific heat (J/g° C.) and thermal conductivity (W/m ° K). Exp-BL.1 and Exp-BL.2 fluids have greater specific heat (heat capacity per unit mass of liquid) than all fluids compared in FIG. 3. Exp-BL.1 and Exp-BL.2 fluids of the disclosure also exhibit improved thermal conductivity over mineral (both naphthenic and isoparaffinic) dielectric fluids, as shown in Table 6.

TABLE 6

Thermal conductivity of various dielectric fluids at 50° C.

|  | Thermal Conductivity at 50° C. (W/m ° K) |
|---|---|
| Exp-BL. 1 | 0.143 |
| Comm-Iso. 1 | 0.133 |
| Comm-Min. 1 | 0.126 |
| Comm-Veg. 1 | 0.145 |

Transformer temperature rise is defined as the average temperature rise of the windings above the ambient (surrounding) temperature, when the transformer is loaded at its nameplate rating. Any temperature increase due to overloading above its nameplate rating adversely affects the insulating paper and other parts used in the construction of the transformer and can be the major cause of reduction in life expectancy of the transformer. Most transformers are designed to operate for a minimum of 20-30 years at their nameplate load, if properly sized, installed and maintained.

Improved specific heat and thermal conductivity of the dielectric fluids discussed in the present disclosure can provide improved cooling to transformers designed and constructed to use conventional fluids such as mineral oil based or vegetable oil based dielectric fluids. Improved cooling capability offers lower temperature rise and, in turn, enables the transformers to have overload capability beyond their nameplate rating without affecting the transformer life expectancy. Also, a cooler running transformer is more reliable and has more up-time. Combined with its improved oxidative stability, the improved cooling performance of dielectric fluid of the current disclosure can provide improved life expectancy and improved overloading capability.

Figure 4:
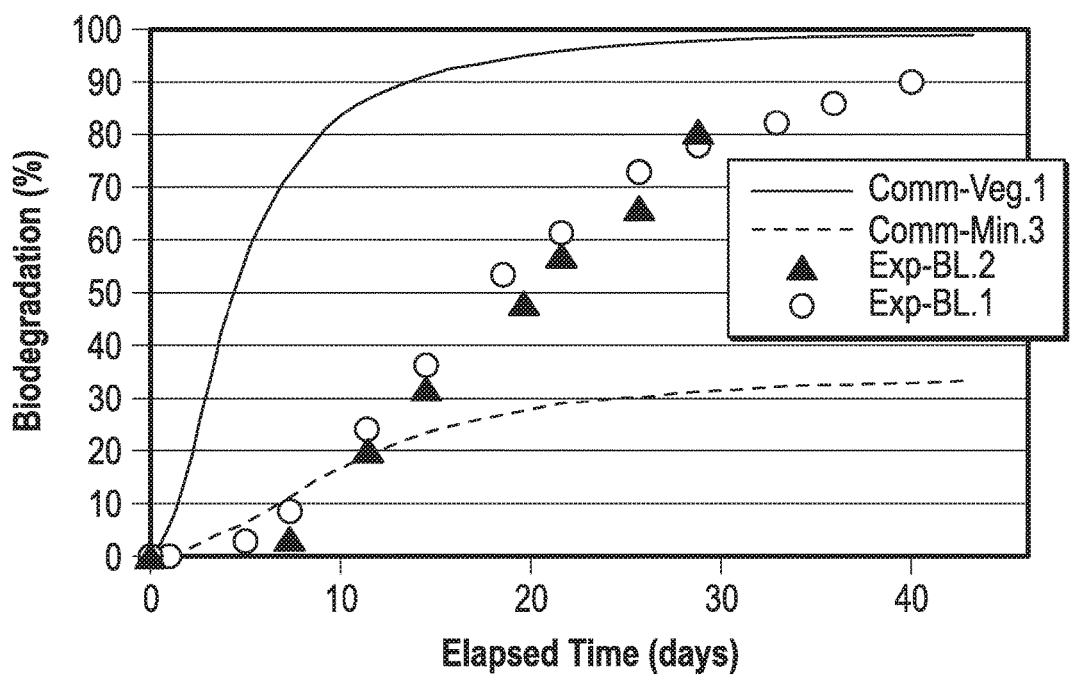
FIG. 4 is a plot comparing percentage biodegradability over time of two example dielectric fluids of one embodiment of the present disclosure with two commercially available dielectric fluids, one being a mineral oil based fluid and the other being a vegetable oil based fluid.

FIG. 4 plots the results of percentage biodegradation of two example biobased base oils for dielectric fluids according to one embodiment of the present disclosure, Exp-BL.1 and Exp-BL.2, over a period of 40 days. Both Exp-BL.1 and Exp-BL.2, comprised of biobased hydrocarbon base oils, showed 74~80% biodegradation at 28 days and 90% biodegradation at 40 days. In contrast, mineral oil based dielectric fluids showed 31% biodegradation at 28 days and 33% biodegradation at 40 days.

At least some advantages of a dielectric fluid formulated with a biobased base oil may also be realized with dielectric fluids formulated with a base oil comprising a blend of biobased base oil with other available base oils, such as for example commercially available mineral oil or vegetable oils. Table 7 shows electrical properties and oxidative stability of two example formulations of one embodiment having such a dielectric fluid blend. Both such examples, Exp-BL.3 and Exp-BL.4, show improved electrical properties and oxidative stability over dielectric fluid formulated without a biobased base fluid. Both Exp-BL.3 and Exp-BL.4 contain 63.74 weight % of biobased base oil, 0.26 weight % of butylated hydroxytoluene (BHT), and 36 weight % of co-base oil. Such blends may carry enhanced environmental benefits (i.e. biodegradability, environmental toxicity, carbon foot print, carbon neutrality, and renewability).

TABLE 7

Electrical properties and oxidative stability of dielectric fluids formulated using base oil blends between biobased hydrocarbon base oil and other commercially available base oils

| name | Exp-BL. 3 | Exp-BL. 4 |
|---|---|---|
| Co-base oil | 36% of Group III* base oil | 36% of Naphthenic base oil |
| Breakdown voltage, kV (ASTM D877-13) | 48 | 46 |
| Power factor %, at 25deg C. (D924-08) | 0.004 | 0.004 |
| Power factor %, at 100deg C. (D924-08) | 0.109 | 0.24 |
| Pour point (° C.) | −42 | −48 |
| Oxidative stability, min, by RPVOT (ASTM-D2112-01a) | 638 | 576 |

*The American Petroleum Institute (API) has categorized base oils into five categories (API 1509, Appendix E). The first three groups are refined from petroleum crude oil. Group IV base oils are full synthetic (polyalphaolefin) oils. Group V is for all other base oils not included in Groups I through IV. Before all the additives are added to the mixture, lubricating oils begin as one or more of these five API groups. Group III base oils, by definition, have greater than 90 percent saturates, less than 0.03 percent sulfur and have a viscosity index above 120. These oils are refined even more than Group II base oils and generally are severely hydrocracked (higher pressure and heat).

The biobased base oils discussed in the test examples comprise a biobased hydrocarbon base oil However, it is contemplated that other biobased base oils, not necessarily hydrocarbon based, but synthesized to have favorable dielectric fluid properties, would also have the benefits of the biobased hydrocarbon base oil dielectric fluids. The foregoing examples demonstrate that the dielectric fluids disclosed herein provide an environmentally safe electrically insulating fluid that has superior or competitive properties to fluids previously available.

The present disclosure further includes the following enumerated embodiments.

Embodiment 1

A dielectric fluid or coolant for electrical apparatuses comprising a biobased hydrocarbon base oil having a molecular weight greater than 300 g/mol and less than 595 g/mol.

Embodiment 2

A dielectric fluid or coolant for electrical apparatuses comprising a biobased base oil having a molecular weight greater than 300 g/mol and less than 595 g/mol, and a power factor at 25° C. less than 0.01% as measured by ASTM-D924-08.

Embodiment 3

The dielectric fluid or coolant of embodiment 1 or 1 b wherein the biobased base oil content is greater than 25%, as measured by ASTM-D6866-12 method, and wherein the dielectric fluid has both of the following properties (a) and (b):
  (a) a dielectric impulse breakdown voltage greater than 270 kV as measured by ASTM-D3300-12 method; and
  (b) a power factor at 25° C. less than 0.01% as measured by ASTM-D924-08,
  and at least one of properties (c) through (f):
  (c) biodegradability as measured by OECD 301B-28 days greater than 60%;
  (d) a flash point greater than 150° C., in the range of about 170 to about 230° C.;

(e) a pour point lower than or in the range of −40 to −54° C.;

(f) an oxidative stability greater than 500 minutes as measured by ASTM-D2112-01a method.

Embodiment 4

The dielectric fluid or coolant of embodiment 3 wherein the dielectric fluid has at least two of the properties (c) to (f) recited in embodiment 3.

Embodiment 5

The dielectric fluid of any preceding enumerated embodiment further comprising additives in an amount ranging from about 50 ppm to about 50 wt %, and selected from the group consisting of antioxidants, metal deactivators, non-biobased hydrocarbon base oils, non-hydrocarbon fluids, and/or gassing-tendency modifiers.

Embodiment 6

The dielectric fluid of embodiment 5 wherein the antioxidant is selected from the group consisting of: hindered phenols; phenolic esters; alkylated diphenylamines; and mixtures thereof, and wherein the amount of the antioxidant in the dielectric fluid is greater than 50 ppm.

Embodiment 7

The dielectric fluid of embodiment 5 wherein the amount of the antioxidant in the dielectric fluid is in the range of about 0.2 wt % to about 0.4 wt %.

Embodiment 8

The dielectric fluid of embodiment 5 wherein the metal deactivator is selected from the group consisting of triazole derivatives and tolutriazole derivatives, and wherein the amount of the metal deactivator in the dielectric fluid is less than 200 ppm.

Embodiment 9

The dielectric fluid of embodiment 5 wherein the amount of metal deactivator in the dielectric fluid is in the range of about 50 ppm to about 100 ppm.

Embodiment 10

The dielectric fluid of embodiment 5 wherein the gassing-tendency modifier is selected from the group consisting of: di-hydronaphthalene compounds; tetra-hydronaphthalene compounds; alkylated hydronaphthalene compounds; alkylated tetrahydronaphthalenes; dihydrophenanthrenes; phenyl ortho xylyl ethanes; alkylated benzenes; tetrahydro-5-(1-phenylethyl)-naphthalene); acenapthenes; tetrahydronaphthalenes; alkylated tetrahydronaphthalenes; tetrahydroquinolines; olefinic hydrocarbons; and combinations thereof, and wherein the amount of the gassing-tendency modifier in the dielectric fluid is less than about 15 wt % of the dielectric fluid Embodiment 11

The dielectric fluid of embodiment 5 wherein the amount of gassing-tendency modifier in the dielectric fluid is in the range of about 1 wt % to about 9 wt % of the dielectric fluid.

Embodiment 12

A dielectric fluid or coolant for electrical apparatuses comprising a biobased base oil with renewable hydrocarbon content greater than 25 wt %, as measured by ASTM-D6866-12 method, and wherein the dielectric fluid provides improved life expectancy and overloading capability due to combination of following properties:
(a) specific heat greater than 2.3 J/g° K at 60° C.;
(b) thermal conductivity greater than 0.142 W/m ° K at 50° C.; and
(c) an oxidative stability greater than 500 minutes as measured by ASTM-D2112-01a method.

Embodiment 13

A dielectric fluid or coolant for electrical apparatuses comprising a biobased base oil having the molecular structure:

$$[B]_n\text{-}[P]_m$$

where,
[B] is biobased hydrocarbon repeating unit;
[P] is non-biobased hydrocarbon repeating unit;
n is non-zero positive integer,
m is non-zero positive integer;
the stereoscopical arrangement of [B] and [P] repeating unit can be linear, branched, or cyclic; and
the sequential arrangement of [B] and [P] can be block or random.

Embodiment 14

The dielectric fluid of embodiment 13 having a molecular weight in the range of 300 g/mol to 595 g/mol.

Embodiment 15

The dielectric fluid of embodiment 13 further comprising additives in an amount ranging about 50 ppm to about 50 wt %, and selected from the group consisting of: antioxidants; metal deactivators; non-biobased hydrocarbon base oils; non-hydrocarbon fluids; and gassing-tendency modifiers.

Embodiment 16

The dielectric fluid of embodiment 15 wherein the antioxidant is selected from the group consisting of: hindered phenols, phenolic esters, alkylated diphenylamines, and mixtures thereof, and the amount of the antioxidant in the dielectric fluid is greater than about 50 ppm.

Embodiment 17

The dielectric fluid of embodiment 15 wherein the antioxidant in the dielectric fluid is in the range of 0.2 wt %~0.4 wt %.

Embodiment 18

The dielectric fluid of embodiment 15 wherein the metal deactivator is selected from the group consisting of: triazole derivatives and tolutriazole derivatives, and the amount of the metal deactivator in the dielectric fluid is below about 200 ppm.

Embodiment 19

The dielectric fluid of embodiment 15 wherein the amount of the metal deactivator in the dielectric fluid is in the range of about 50 ppm to about 100 ppm.

Embodiment 20

The dielectric fluid of embodiment 15 wherein the non-biobased hydrocarbon base oil is selected from the group consisting of: poly alpha olefins; naphthenic oils; paraffinic oils; and combinations thereof, and the amount of the non-biobased hydrocarbon base oil in the dielectric fluid is less than about 50%.

Embodiment 21

The dielectric fluid of embodiment 15 wherein the amount of the non-biobased hydrocarbon base oil in the dielectric fluid is in the range of about 5 wt % to about 45 wt %.

Embodiment 22

The dielectric fluid of embodiment 15 wherein the non-hydrocarbon fluid is selected from the group consisting of: vegetable oils; seed oils; silicone fluids; synthetic esters; natural esters; and combinations thereof, and the amount of the non-hydrocarbon fluid in the dielectric fluid is less than about 50 wt %.

Embodiment 23

The dielectric fluid of embodiment 15 wherein the amount of the non-hydrocarbon fluid in the dielectric fluid is in the range of about 5 wt % to about 45 wt %.

Embodiment 2422

The dielectric fluid of embodiment 15 wherein the gassing-tendency modifier is selected from the group consisting of: di-hydronaphthalene compounds; tetra-hydronaphthalene compounds; alkylated hydronaphthalene compounds; alkylated tetrahydronaphthalenes; dihydrophenanthrenes; phenyl ortho xylyl ethanes; alkylated benzenes; tetrahydro-5-(1-phenylethyl)-naphthalene); acenapthenes; tetrahydronaphthalenes; alkylated tetrahydronaphthalenes; tetrahydroquinolines; olefinic hydrocarbons; and combinations thereof, and the amount of the gassing tendency modifier in the dielectric fluid is less than about 15 wt % of the dielectric fluid.

Embodiment 25

The dielectric fluid of embodiment 15 wherein the amount of gassing tendency modifier in the dielectric fluid is in the range of about 1 wt % to about 9 wt %.

Embodiment 26

The dielectric fluid of embodiment 25 where the fluid has a specific heat greater than 2.3 J/g° K at 60° C.

Embodiment 27

A dielectric fluid comprising a gassing tendency modifier for use in a transformer or similar electrical apparatus, wherein the modifier comprises a non-saturated olefin which imparts to the fluid a gassing tendency of less than about 10 μL/min as measured by ASTM-D2300-08.

Embodiment 28

The gassing tendency modifier of embodiment 27 wherein the olefin is selected from group consisting of: terpene; non-terpene olefin with linear or lightly branched (e.g., containing 1 or 2 branches) and number of carbons ranging C6–C20; and combinations thereof.

Embodiment 29

A dielectric fluid or coolant for electrical apparatuses comprising a biobased base oil having the molecular structure:

$$[B]_n\text{-}[P]_m$$

where,
[B] is biobased repeating unit;
[P] is non-biobased hydrocarbon repeating unit;
n is greater than 1,
m is less than 4;
the stereoscopical arrangement of [B] and [P] repeating unit can be linear; branched, or cyclic;
the sequential arrangement of [B] and [P] can be block or random;
the molecular weight is in the range of 300 g/mol to 595 g/mol;
the biobased content is greater than 25%, as measured by ASTM-D6866-12 method; and
the fluid has a dielectric impulse breakdown voltage greater than 270 kV as measured by ASTM-D3300-12 method; and a power factor at 25° C. less than 0.01% as measured by ASTM-D924-08.

Embodiment 30

The dielectric fluid of embodiment 29 further comprising additives in an amount ranging about 50 ppm to about 50 wt %, and selected from the group consisting of: antioxidants; metal deactivators; non-biobased hydrocarbon base oils; non-hydrocarbon fluids; and/or gassing-tendency modifiers.

Embodiment 31

The dielectric fluid of embodiment 30 wherein the non-biobased hydrocarbon base oil is selected from the group consisting of: poly alpha olefins; naphthenic oils; paraffinic oils; and combinations thereof, and the amount of the non-biobased hydrocarbon base oil in the dielectric fluid is less than about 50%.

Embodiment 32

The dielectric fluid of embodiment 30 wherein the amount of non-biobased hydrocarbon base oil in the dielectric fluid is in the range of about 5 wt % to about 45 wt %.

Embodiment 33

The dielectric fluid of embodiment 30 wherein the non-biobased hydrocarbon base oil is selected from the group consisting of: vegetable oils; seed oils; silicone fluids; synthetic esters; natural esters, and combinations thereof, and the amount of the non-hydrocarbon fluid in the dielectric fluid is less than about 50%.

Embodiment 34

The dielectric fluid of embodiment 31 wherein the amount of the non-biobased hydrocarbon base oil in the dielectric fluid is in the range of about 5 wt % to about 45 wt %.

Embodiment 35

A method for increasing the power output of a transformer or other electrical apparatus comprising insulating and/or cooling at least some of the electrical apparatus components with a biobased oil dielectric fluid having at least one of the following properties:
(a) a dielectric impulse breakdown voltage greater than 270 kV as measured by ASTM-D3300-12 method;
(b) a power factor at 25° C. less than 0.01% as measured by ASTM-D924-08;
(c) specific heat greater than 2.3 J/g° K at 60° C.; and
(d) thermal conductivity greater than 0.142 W/m ° K at 50° C.

Embodiment 36

The method of embodiment 35 wherein the biobased dielectric fluid has a molecular weight greater than 300 g/mol and less than 595 g/mol such that the biobased base oil content of the dielectric fluid is greater than 25%, as measured by ASTM-D6866-12 method.

Embodiment 37

The method of embodiment 35 wherein the biobased base oil has the molecular structure:

$[B]_n\text{-}[P]_m$ where,
[B] is biobased repeating unit;
[P] is non-biobased hydrocarbon repeating unit;
n is greater than 1,
m is less than 4;
the stereoscopical arrangement of [B] and [P] repeating unit can be linear, branched, or cyclic.
the sequential arrangement of [B] and [P] can be block or random;
the molecular weight is in range of 300 g/mol to 595 g/mol; and
the biobased content is greater than 25%, as measured by ASTM-D6866-12 method.

Embodiment 38

A device comprising an electrical component; and a dielectric fluid of any of embodiments 1, 1b, or 2-32 in operative communication with the electrical component.

Embodiment 39

The device of embodiment 38 wherein the electrical component comprises a cellulose-based insulation material in contact with the dielectric fluid.

Embodiment 40

The device of embodiment 38 wherein the electrical component is selected from the group consisting of a transformer, a capacitor, a switch, a regulator, a circuit breaker, a recloser, a fluid-filled transmission line, and combinations thereof.

Embodiment 41

A device selected from the group consisting of a transformer, a capacitor, a switch, a regulator, a circuit breaker, a recloser, a fluid-filled transmission line, and combinations thereof comprising a dielectric fluid with a gassing-tendency modifier selected from the group consisting of: di-hydronaphthalene compounds; tetra-hydronaphthalene compounds; alkylated hydronaphthalene compounds; alkylated tetrahydronaphthalenes; dihydrophenanthrenes; phenyl ortho xylyl ethanes; alkylated benzenes; tetrahydro-5-(1-phenylethyl)-naphthalene); acenapthenes; tetrahydronaphthalenes; alkylated tetrahydronaphthalenes; tetrahydroquinolines; olefinic hydrocarbons; and combinations thereof, and the amount of the gassing tendency modifier in the dielectric fluid is less than about 15 wt % of the dielectric fluid.

Embodiment 42

A device selected from the group consisting of a transformer, a capacitor, a switch, a regulator, a circuit breaker, a recloser, a fluid-filled transmission line, and combinations thereof comprising a dielectric fluid with a gassing tendency modifier comprising a non-saturated olefin which imparts to the fluid a gassing tendency of less than about 10 µL/min as measured by ASTM D2300-08.

Embodiment 43

The device of embodiment 42 wherein the olefin in the gassing tendency modifier is selected from group consisting of: terpenes; non-terpene olefins which are linear or lightly branched (e.g., containing 1 or 2 branches) and have their number of carbons ranging C6~C20; and combinations thereof.

Embodiment 44

A device selected from the group consisting of a transformer, a capacitor, a switch, a regulator, a circuit breaker, a recloser, a fluid-filled transmission line, and combinations thereof comprising a dielectric fluid comprising a biobased base oil having a molecular weight greater than 300 g/mol and less than 595 g/mol.

Embodiment 45

A device selected from the group consisting of a transformer, a capacitor, a switch, a regulator, a circuit breaker, a recloser, a fluid-filled transmission line, and combinations thereof comprising a dielectric fluid comprising a biobased base oil content greater than 25%, as measured by ASTM-D6866-12 method, and wherein the dielectric fluid has both of the following properties (a) and (b):
(a) a dielectric impulse breakdown voltage greater than 270 kV as measured by ASTM-D3300-12 method; and
(b) a power factor at 25° C. less than 0.01% as measured by ASTM-D924-08, and
one or more of following properties (c) through (f):
(c) biodegradability as measured by OECD 301B-28 days greater than 60%;
(d) a flash point greater than 150° C., in the range of about 170 to about 230° C.;
(e) a pour point lower than or in the range of −40 to −54° C.; and (f) an oxidative stability greater than 500 minutes as measured by ASTM-D2112-01a method.

Embodiment 46

A device selected from the group consisting of a transformer, a capacitor, a switch, a regulator, a circuit breaker, a recloser, a fluid-filled transmission line, and combinations thereof comprising a biobased dielectric fluid having a molecular weight greater than 300 g/mol and less than 595 g/mol such that the biobased base oil content of the dielectric fluid is greater than 25%, as measured by ASTM-D6866-12 method.

Embodiment 47

The device of embodiment 46 wherein the biobased base oil in the dielectric fluid has the molecular structure:

$[B]_n$-$[P]_m$ where,
[B] is biobased repeating unit;
[P] is non-biobased hydrocarbon repeating unit;
n is greater than 1, and m is less than 4;
the stereoscopical arrangement of [B] and [P] repeating unit can be linear, branched, or cyclic.
the sequential arrangement of [B] and [P] can be block or random; and
the molecular weight is in range of 300 g/mol to 595 g/mol; and
where the biobased content is greater than 25%, as measured by ASTM-D6866-12 method.

Embodiment 48

The device of any of embodiments 38 to 47 wherein the device is a transformer.

Embodiment 49

A dielectric fluid comprising: a farnesene-based oligomer having a molecular weight greater than 300 g/mol and less than 595 g/mol; and an antioxidant wherein the farnesene-based oligomer is biobased.

Embodiment 50

The dielectric fluid of embodiment 48 comprising from 0.1 wt % to 2.0 wt % antioxidant.

Embodiment 51

The dielectric fluid of embodiment 49 or 50 wherein the farnesene-based oligomer comprises a farnesene dimer.

Embodiment 52

The dielectric fluid of embodiment 49 or 50 wherein the farnesene-based oligomer is a farnesene/terpenoid oligomer with the structure (IV)

-$[F]m$-$[T]n$-     (IV)

wherein F represents units derived from farnesene;
T represents units derived from one or more terpenoids;
each of m and n is an integer from 1 to 9, and 3<m+n<10.

Embodiment 53

The dielectric fluid of embodiment 52 wherein the farnesene/terpenoid oligomer comprises from 70 wt % to 99 wt % units derived from farnesene and from 30 wt % to 1 wt % units derived from terpenoid(s).

Embodiment 54

The dielectric fluid of any of embodiments 52 to 53 wherein the terpenoid is selected from the group consisting of zingiberene, bisabolene, farnesene epoxide, farnesol, squalene, ergosol, and combinations thereof.

Embodiment 55

The dielectric fluid of embodiment 52 comprising a blend component selected from the group consisting of a microbial oil, a vegetable oil, a seed oil, a mineral oil, silicon fluid, a synthetic ester, a poly-alpha-olefin, and combinations thereof.

Embodiment 56

A device comprising an electrical component; and a dielectric fluid of embodiment 52 in operative communication with the electrical component.

Embodiment 57

The device of embodiment 56 wherein the electrical component comprises a cellulose-based insulation material in contact with the dielectric fluid.

Embodiment 58

The device of embodiment 56 wherein the electrical component is selected from the group consisting of a transformer, a capacitor, a switch, a regulator, a circuit breaker, a recloser, a fluid-filled transmission line, and combinations thereof.

Embodiment 59

A transformer comprising a dielectric fluid of any of embodiments 1, 1b, and 2-32.

Embodiment 60

The dielectric fluid, coolant or device of any preceding enumerated embodiment wherein the biobased base oil is derived from farnesene.

Embodiment 61

The dielectric fluid, coolant or device of any preceding enumerated embodiment wherein the biobased base oil has a molecular weight in range of 390 g/mol to 510 g/mol.

Various embodiments have been described. However, the present disclosure is not intended to be limited to these embodiments and illustrations contained herein. The disclosure includes modified forms of the described embodiments, including portions of the embodiments and combinations of elements of different embodiments. These and other embodiments are within the scope of the following claims.

What is claimed is:
1. A dielectric fluid or coolant for electrical apparatuses comprising:
a biobased hydrocarbon base oil having a molecular weight greater than 300 g/mol and less than 595 g/mol, the biobased hydrocarbon base oil comprising a co- oligomer of a partially hydrogenated conjugated hydrocarbon terpene with an alpha olefin, and having a renewable hydrocarbon content greater than 25%, as measured by ASTM-D6866-12 method, and a gassing tendency modifier comprising a mono-olefin.

2. The dielectric fluid or coolant for electrical apparatuses of claim 1 comprising a biobased base oil having a molecular weight greater than 300 g/mol and less than 595 g/mol, and a power factor at 25° C. less than 0.01% as measured by ASTM-D924-08.

3. The dielectric fluid or coolant of claim 1 wherein the biobased base oil content is greater than 25%, as measured by the method of ASTM-D6866-12, and wherein the dielectric fluid or coolant has both of the following properties (a) and (b):
(a) a dielectric impulse breakdown voltage greater than 270 kV as measured by ASTM-D3300-12 method; and
(b) a power factor at 25° C. less than 0.01% as measured by ASTM-D924-08, and
the dielectric fluid or coolant further has one or more of following properties (c) through (f):
(c) biodegradability as measured by OECD 301 B-28 days greater than 60%;
(d) a flash point greater than 150° C., in the range of about 170 to about 230° C.;
(e) a pour point lower than or in the range of −40 to −54° C.; and
(f) an oxidative stability greater than 500 minutes as measured by ASTM-D2112-01a method.

4. The dielectric fluid or coolant of claim 1, the dielectric fluid or coolant further comprising additives in an amount ranging from about 50 ppm to about 50 wt %, and selected from the group consisting of antioxidants, metal deactivators, non-biobased hydrocarbon base oils, and non-hydrocarbon fluids.

5. The dielectric fluid or coolant of claim 4 wherein the antioxidant is selected from the group consisting of: hindered phenols; phenolic esters; alkylated diphenylamines; and mixtures thereof, and wherein the amount of the antioxidant in the dielectric fluid is greater than 50 ppm.

6. The dielectric fluid or coolant of claim 4 wherein the amount of the antioxidant in the dielectric fluid or coolant is in the range of about 0.2 wt % to about 0.4 wt %.

7. The dielectric fluid or coolant of claim 4 wherein the metal deactivator is selected from the group consisting of triazole derivatives and tolutriazole derivatives, and wherein the amount of the metal deactivator in the dielectric fluid or coolant is less than 200 ppm.

8. The dielectric fluid or coolant of claim 4 wherein the amount of metal deactivator in the dielectric fluid or coolant is in the range of about 50 ppm to about 100 ppm.

9. The dielectric fluid or coolant of claim 1 further comprising a gassing-tendency modifier comprising at least one selected from the group consisting of: di-hydronaphthalene compounds; tetra-hydronaphthalene compounds; alkylated hydronaphthalene compounds; alkylated tetrahydronaphthalenes; dihydrophenanthrenes; phenyl ortho xylyl ethanes; alkylated benzenes; tetrahydro-5-(1-phenylethyl)-naphthalene; acenapthenes; tetrahydronaphthalenes; alkylated tetrahydronaphthalenes; tetrahydroquinolines; olefinic hydrocarbons; and combinations thereof, and wherein the amount of the gassing-tendency modifier in the dielectric fluid or coolant is less than about 15 wt % of the dielectric fluid or coolant.

10. A dielectric fluid or coolant for electrical apparatuses comprising:

a biobased base oil having a molecular weight greater than 300 g/mol and less than 595 g/mol, comprising a co-oligomer of a partially hydrogenated conjugated hydrocarbon terpene with an alpha olefin, and with renewable hydrocarbon content greater than 25%, as measured by ASTM-D6866-12 method; and a gassing tendency modifier in an amount ranging from about 50 ppm to about 50 wt %, and wherein the dielectric fluid or coolant possess the following properties:
(a) specific heat greater than 2.3 J/g ° K at 60° C.;
(b) thermal conductivity greater than 0.142 W/m ° K at 50° C.; and
(c) an oxidative stability greater than 500 minutes as measured by ASTM-D2112-01a method.

11. The dielectric fluid or coolant of claim 4 wherein the non-biobased hydrocarbon base oil is selected from the group consisting of: poly alpha olefins; naphthenic oils; paraffinic oils; and combinations thereof, and the amount of the non-biobased hydrocarbon base oil in the dielectric fluid or coolant is less than about 50 wt % of the dielectric fluid or coolant.

12. The dielectric fluid or coolant of claim 4 wherein the amount of the non-biobased hydrocarbon base oil in the dielectric fluid or coolant is in the range of about 5 wt % to about 45 wt % of the dielectric fluid or coolant.

13. The dielectric fluid or coolant of claim 4 wherein the non-hydrocarbon fluid is selected from the group consisting of: vegetable oils; seed oils; silicone fluids; synthetic esters; natural esters; and combinations thereof, and the amount of the non-hydrocarbon fluid in the dielectric fluid or coolant is less than about 50 wt % of the dielectric fluid or coolant.

14. The dielectric fluid or coolant of claim 4 wherein the amount of the non-hydrocarbon fluid in the dielectric fluid or coolant is in the range of about 5 wt % to about 45 wt % of the dielectric fluid or coolant.

15. The dielectric fluid or coolant of claim 1 wherein the amount of gassing tendency modifier in the dielectric fluid or coolant is in the range of about 1 wt % to about 9 wt %.

16. The dielectric fluid or coolant of claim 3 where the dielectric fluid or coolant has a specific heat greater than 2.3 J/g ° K at 60° C.

17. A dielectric fluid or coolant of claim 4 for electrical apparatuses comprising a biobased base oil having the molecular structure:

where,
[B] is biobased repeating unit;
[P] is non-biobased hydrocarbon repeating unit;
n is greater than 1,
m is less than 4;
the stereoscopical arrangement of [B] and [P] repeating unit can be linear; branched, or cyclic;
the sequential arrangement of [B] and [P] can be block, random, or alternating order;
the molecular weight is in range of 300 g/mol to 595 g/mol;
the biobased content is greater than 25%, as measured by ASTM-D6866-12 method; and
the dielectric fluid or coolant has a dielectric impulse breakdown voltage greater than 270 kV as measured by ASTM-D3300-12 method and a power factor at 25° C. less than 0.01% as measured by ASTM-D924-08.

18. The dielectric fluid or coolant of claim 17 further comprising additives in an amount ranging about 50 ppm to about 50 wt %, and selected from the group consisting of:

antioxidants; metal deactivators; non-biobased hydrocarbon base oils; and non-hydrocarbon fluids.

19. The dielectric fluid or coolant of claim 1, wherein the gassing tendency modifier is provided in an amount ranging from about 50 ppm to about 50 wt %.

* * * * *